(12) United States Patent
Bozorgi

(10) Patent No.: US 11,512,912 B2
(45) Date of Patent: *Nov. 29, 2022

(54) HIGH PERFORMANCE TWO-PHASE COOLING APPARATUS FOR PORTABLE APPLICATIONS

(71) Applicant: PiMEMS, Inc., Pleasanton, CA (US)

(72) Inventor: Payam Bozorgi, Santa Barbara, CA (US)

(73) Assignee: PiMEMS, Inc., Pleasanton, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 16/858,781

(22) Filed: Apr. 27, 2020

(65) Prior Publication Data

US 2020/0256628 A1 Aug. 13, 2020

Related U.S. Application Data

(63) Continuation of application No. 15/590,621, filed on May 9, 2017, now Pat. No. 10,670,352.

(60) Provisional application No. 62/340,308, filed on May 23, 2016.

(51) Int. Cl.
| | |
|---|---|
| *G06F 1/20* | (2006.01) |
| *F28F 21/08* | (2006.01) |
| *F28D 15/02* | (2006.01) |
| *F28D 15/04* | (2006.01) |
| *H01L 23/427* | (2006.01) |
| *H01L 23/373* | (2006.01) |

(52) U.S. Cl.
CPC ........ *F28F 21/086* (2013.01); *F28D 15/0233* (2013.01); *F28D 15/046* (2013.01); *H01L 23/427* (2013.01); *F28F 2255/20* (2013.01); *F28F 2260/00* (2013.01); *F28F 2275/067* (2013.01); *H01L 23/3736* (2013.01)

(58) Field of Classification Search
CPC ...... F28D 15/02; F28D 15/0233; F28D 15/04; F28D 15/046; G06F 1/203
See application file for complete search history.

(56) References Cited

U.S. PATENT DOCUMENTS

| | | | |
|---|---|---|---|
| 7,718,552 B2 | 5/2010 | Samah et al. | |
| 2011/0120674 A1* | 5/2011 | MacDonald | .......... H01L 23/427 29/890.03 |
| 2013/0327504 A1 | 12/2013 | Bozorgi et al. | |
| 2014/0126167 A1 | 5/2014 | Bozorgi et al. | |
| 2014/0360701 A1* | 12/2014 | Aoki | ....................... F28D 15/04 165/104.21 |

(Continued)

FOREIGN PATENT DOCUMENTS

JP 2009168326 A * 7/2009 ........... F28D 15/046

*Primary Examiner* — Eric S Ruppert
(74) *Attorney, Agent, or Firm* — Botkin & Hall, LLP

(57) ABSTRACT

The present application discloses two-phase cooling devices that may include at least three substrates: a metal with a wicking structure, an intermediate substrate and a backplane. A fluid may be contained within the wicking structure and vapor cavity for transporting thermal energy from one region of the thermal ground plane to another region of the thermal ground plane, wherein the fluid may be driven by capillary forces within the wicking structure. The titanium thermal ground plane may be adapted for use in a mobile device, such as a portable device or smartphone, where it may offer compelling performance advantages.

1 Claim, 19 Drawing Sheets

Evaporator Region

(56) References Cited

U.S. PATENT DOCUMENTS

| | | |
|---|---|---|
| 2015/0196380 A1 | 7/2015 | Berrada et al. |
| 2016/0037681 A1 | 2/2016 | Lee et al. |
| 2016/0216042 A1 | 7/2016 | Bozorgi et al. |

* cited by examiner

Evaporator Region

Adiabatic Region

Condenser Region

Evaporator Region

Adiabatic Region

HIGH PERFORMANCE TWO-PHASE COOLING APPARATUS FOR PORTABLE APPLICATIONS

CROSS REFERENCE TO RELATED APPLICATIONS

This non-Provisional patent application is a continuation application, claiming priority to U.S. nonprovisional patent application Ser. No. 15/590,621, filed May 9, 2017, which in turn claims priority to U.S. Provisional Patent Application Ser. No. 62/340,308, filed May 23, 2016. These prior applications are incorporated by reference in its entirety for all purposes.

STATEMENT REGARDING FEDERALLY SPONSORED RESEARCH

Not applicable.

STATEMENT REGARDING MICROFICHE APPENDIX

Not applicable.

BACKGROUND

This invention relates to cooling of semiconductor devices, and, more particularly, to cooling systems to cool semiconductor and other devices.

Electronics employing various semiconductor devices and integrated circuits are commonly subjected to various environmental stresses. Applications of such electronics are extremely widespread, and utilize different semiconductor materials.

Many electronic environments, such as mobile devices or laptop computers have thin planar configurations, where many components are efficiently packed into a very confined space. As a result, cooling solutions must also conform to thin/planar configurations. Heat spreaders in the form of thin thermal ground planes (TGPs) may be desirable for many electronic cooling applications.

SUMMARY

The present application discloses two-phase cooling devices. Two-phase cooling devices are a class of devices that can transfer heat with very high efficiency, and may include: heat pipes, thermal ground planes, vapor chambers and thermosiphons, and the like.

In some embodiments, the present application provides two-phase cooling devices including at least three substrates. In some embodiments, one or more of the substrates is formed from microfabricated metal, such as but not limited to titanium, aluminum, copper, or stainless steel. In some embodiments the substrate may be formed as a thermal ground plane structure suitable for use in electronic devices. In some embodiments, the two-phase device may comprise a predetermined amount of at least one suitable working fluid, where the working fluid adsorbs or rejects heat by changing phases between liquid and vapor.

In some embodiments, the present application may provide two-phase cooling devices including a metal, such as but not limited to titanium, aluminum, copper, or stainless steel, substrate comprising a plurality of etched microstructures, forming a wicking structure wherein one or more of the microstructures have a height of between about 1-1000 micrometers, a width of between about 1-1000 micrometers, and a spacing of between about 1-1000 micrometers. In some embodiments a vapor cavity may be in communication with the plurality of metal microstructures. In some embodiments at least one intermediate substrate may be in communication with the wicking structure and the vapor region. In some embodiments, a fluid may be contained within the wicking structure and vapor cavity for transporting thermal energy from one region of the thermal ground plane to another region of the thermal ground plane, wherein the fluid may be driven by capillary forces within the wicking structure.

In some embodiments the cooling device can be configured for high capillary force in the wicking structure, to support large pressure differences between the liquid and vapor phases, while minimizing viscous losses of the liquid flowing in the wicking structure. In some embodiments, the cooling device may be a thermal ground plane which can be made very thin, and could possibly transfer more thermal energy than can be achieved by earlier TGP's. In some embodiments, different structural components could be located in an evaporator region, an adiabatic region and a condenser region. In some embodiments, an evaporator region may contain an intermediate substrate that comprises a plurality of microstructures that when mated with the wicking structure form high aspect ratio structures. In some embodiments, the intermediate substrate features are interleaved with the wicking structure features to increase the effective aspect ratio of the wicking structure. In some embodiments, an adiabatic region may contain an intermediate substrate positioned in close proximity to the wicking structure to separate the vapor in the vapor chamber from the liquid in the wicking structure. In some embodiments, a condenser region may contain an intermediate substrate that has large openings (compared to the micro structure) so that the wicking structure is in direct communication with the vapor chamber. In some embodiments, a condenser region might not contain an intermediate substrate so that the wicking structure is in direct communication with the vapor chamber.

Portable devices have stringent requirements on size, power consumption and battery lifetime. These performance attributes are often interrelated, such that a smaller, lighter enclosure may get hotter which may degrade battery performance. Accordingly, the titanium thermal ground plane may be adapted for use in portable devices, wherein its improved thermal performance, small size, and mechanical strength are significant advantages over other heat pipe technologies.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

Figure 1:
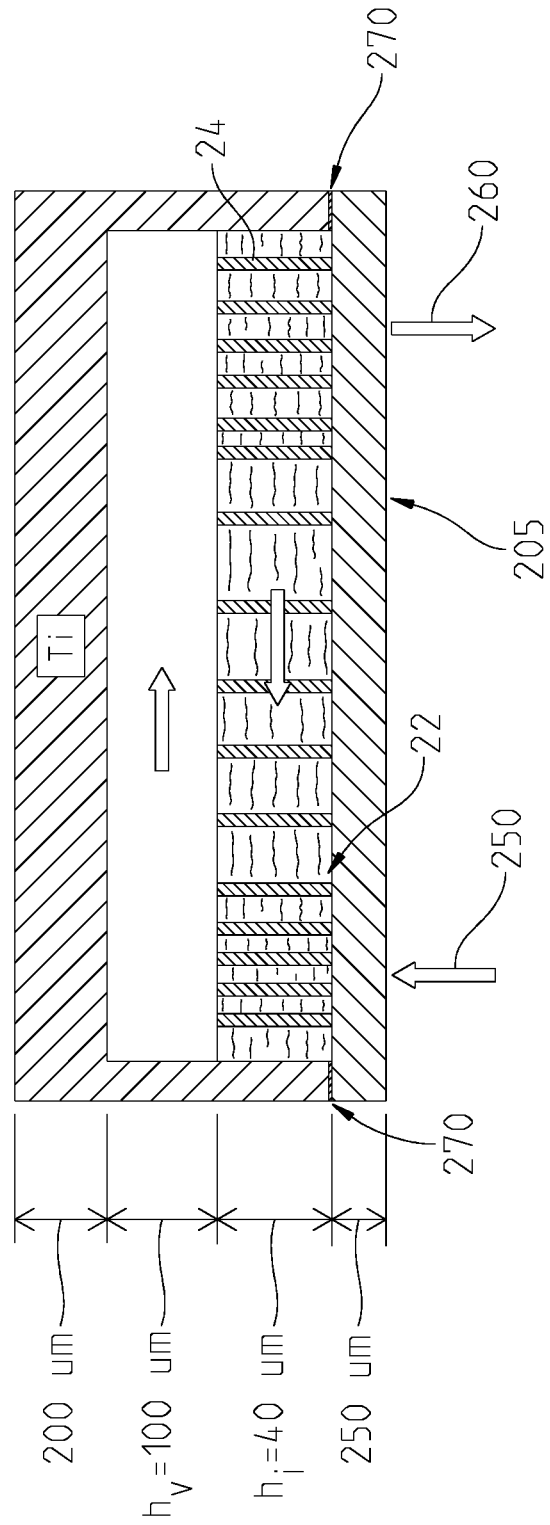
FIG. 1 is an illustrative embodiment of an earlier titanium-based thermal ground plane, comprising a titanium substrate with a wicking structure, a backplane, and a vapor chamber.

The first portion of this description is directed to the details of the novel titanium thermal ground plane. The later portion describes its application to portable devices.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention. The following reference numbers are used to refer to the following features:

21 Ti substrate
22 wicking structure
24 pillars
28 grooves
120 backplane
110 intermediate substrate
210 wicking structure
205 metal substrate
140 liquid
212 metal
180 meniscus
250 heat source
260 heat sink
122 supporting pillars
112 microstructures
300 vapor chamber
170, 270 laser weld
400, 480, 1000 portable device
410 front surface
420 middle frame
430 back surface
440 heat pipe
450, 452 chip
510 wick structure, 511, 512
120, 520 ti back plane
525 Ti middle frame
530, 531, 532 vapor cavity
555 common member
500, 600, 700, 800, 900 TiTGPs In some embodiments, the thermal ground planes disclosed here could be used to provide efficient space utilization for cooling semiconductor devices in a large range of applications, including but not limited to aircraft, satellites, laptop computers, desktop computers, mobile devices, automobiles, motor vehicles, heating air conditioning and ventilation systems, and data centers.

Microfabricated substrates can be used to make more robust, shock resistant two-phase cooling devices, which may be in the form of Thermal Ground Planes (TGPs). Although a variety of materials for these substrates may be employed, as described in the incorporated references, metal, such as but not limited to titanium, aluminum, copper, or stainless steel substrates have been found suitable for TGPs.

The choice of metal can depend upon the various applications and cost considerations. There are advantages to various metals. For example, copper offers the highest thermal conductivity of all the metals. Aluminum can be advantageous for applications where high thermal conductivity is important and weight might be important. Stainless steel could have advantageous in certain harsh environments.

Titanium has many advantages. For example, titanium has a high fracture toughness, can be micro fabricated and micromachined, can resist high temperatures, can resist harsh environments, can be bio-compatible. In addition, titanium-based thermal ground planes can be made light weight, relatively thin, and have high heat transfer performance. Titanium can be pulse laser welded. Since titanium has a high fracture toughness, it can be formed into thin substrates that resist crack and defect propagation. Titanium has a relatively low coefficient of thermal expansion of approximately $8.6 \times 10$-6/K. The low coefficient of thermal expansion, coupled with thin substrates can help to substantially reduce stresses due to thermal mismatch. Titanium can be oxidized to form Nano Structured Titania (NST), which forms stable and super hydrophilic surfaces. In some embodiments, titanium (Ti) substrates with integrated Nano Structured Titania (NST) have been found suitable for TGP's.

Metals, such as but not limited to titanium, aluminum, copper, or stainless steel, can be microfabricated with controlled characteristic dimensions (depth, width, and spacing) ranging from about 1-1000 micrometers, to engineer the wicking structure and intermediate substrate for optimal performance and customized for specific applications. In some embodiments, the controlled characteristic dimensions (depth, width, and spacing) could range from 10-500 micrometers, to engineer the wicking structure for optimal performance and customized for specific applications.

In some embodiments, titanium can be oxidized to form nanostructured titania (NST), which could provide super hydrophilic surfaces and thereby increase capillary forces, and enhance heat transfer. In some embodiments, the NST can be comprised of hair-like patterns with a nominal roughness of 200 nanometers (nm). In some embodiments, NST can have a nominal roughness of 1-1000 nm.

In some embodiments aluminum can be oxidized to form hydrophilic nanostructures, to provide super hydrophilic coatings. In some embodiments, sintered nanoparticles and/or microparticles could be used to provide super hydrophilic surfaces and thereby increase capillary forces, and enhance heat transfer.

In some embodiments, titanium can be coated on another type of substrate forming a titanium film. The titanium film can be oxidized to form nano-structured titania (NST), and thereby provide super hydrophilic surfaces.

Titanium is a material that can be microfabricated using cleanroom processing techniques, macro-machined in a machine shop, and hermetically packaged using a pulsed laser micro welding technique. When the thermal ground plane is comprised of only titanium or titania as the structural material, the various components can be laser welded in place, without introducing contaminants, which could possibly produce non-condensable gasses, contribute to poor performance, and possibly lead to failure. In addition, titanium and titania have been shown to be compatible with water, which can contribute to long lifetimes and minimal non-condensable gas generation. Accordingly, the titanium substrate may be connected to the titanium backplane 120 by a laser weld, to form a hermetically-sealed vapor cavity.

Metals can be bonded to form hermetic seals. In some embodiments, titanium substrates can be pulsed laser microwelded together to form a hermetic seal. In other embodiments, copper, aluminum, and stainless steel substrates could be welded using a variety of techniques, such as but not limited to, soldering, brazing, vacuum brazing, TIG, MIG, and many other well-known welding techniques.

The present application describes the fabrication of metal-based Thermal Ground Planes (TGPs). Without loss of generality, the present application discloses thermal ground plane embodiments that could be comprised of three or more metal substrates.

An embodiment can comprise three substrates (of which one or more can be constructed using a metal, such as but not limited to titanium, aluminum, copper, or stainless steel) to form a thermal ground plane. In some embodiments, titanium substrates could be used to form a thermal ground plane. In some embodiments, one substrate supports an integrated super-hydrophilic wicking structure 210, a second substrate consists of a deep-etched (or macromachined) vapor cavity, and a third intermediate substrate 110 may consist of microstructures 112 that are in communication with the wicking structure 210 and the vapor chamber 300. The substrates could be laser micro welded together to form the thermal ground plane.

The working fluid can be chosen based upon desired performance characteristics, operating temperature, material compatibility, or other desirable features. In some embodiments, and without loss of generality, water could be used as the working fluid. In some embodiments, and without loss of generality, helium, nitrogen, ammonia, high-temperature organics, mercury, acetone, methanol, Flutec PP2, ethanol, heptane, Flutec PP9, pentane, caesium, potassium, sodium, lithium, or other materials, could be used as the working fluid.

The current TGP can provide significant improvement over earlier titanium-based thermal ground planes. For example, the present invention could provide significantly higher heat transfer, thinner thermal ground planes, thermal ground planes that are less susceptible to the effects of gravity, and many other advantages.

The following co-pending and commonly-assigned U.S. patent applications are related to the instant application, and are incorporated by reference in their entirety: U.S. Pat. No. 7,718,552 B2, issued May 18, 2010, by Samah, et al, entitled "NANOSTRUCTURED TITANIA," which application is incorporated by reference herein. U.S. Patent Application Ser. No. 61/082,437, filed on Jul. 21, 2008, by Noel C. MacDonald et al., entitled "TITANIUM-BASED THERMAL GROUND PLANE," which application is incorporated by reference herein. U.S. patent application Ser. No. 13/685,579, filed on Nov. 26, 2012, by Payam Bozorgi et al., entitled "TITANIUM-BASED THERMAL GROUND PLANE," which application is incorporated by reference herein. PCT Application No. PCT/US2012/023303, filed on Jan. 31, 2012, by Payam Bozorgi and Noel C. MacDonald, entitled "USING MILLISECOND PULSED LASER WELDING IN MEMS PACKAGING," which application is incorporated by reference herein. U.S. Patent Provisional Application Ser. No. 62/017,455, filed on Jun. 26, 2014, by Payam Bozorgi and Carl Meinhart, entitled "TWO-PHASE COOLING DEVICES WITH LOW-PROFILE CHARGING PORTS," which application is incorporated by reference herein.

FIG. 1 illustrates a thermal ground plane, which in some embodiments may be a titanium-based thermal ground plane, comprising a titanium substrate with a wicking structure, a backplane, and a vapor chamber described in the incorporated references. The device may be pulsed microwelded to form a hermetic seal. The thermal ground plane can be charged with a working fluid, such as water in a thermodynamically saturated state, where the liquid phase resides predominantly in the wicking structure, and the vapor phase resides predominantly in the vapor chamber.

Figure 2A:
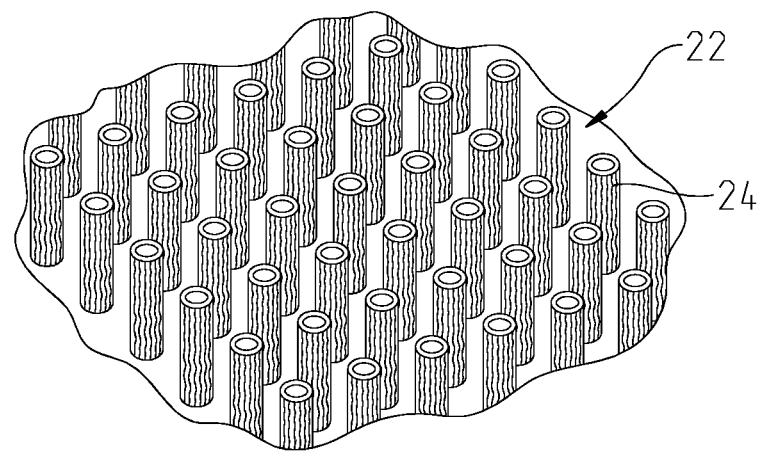
FIG. 2 is an illustrative embodiment of earlier titanium substrates with a wicking structure: (A) the wicking structure comprises pillars, (B) the wicking structure comprises channels or grooves.
Figure 2B:
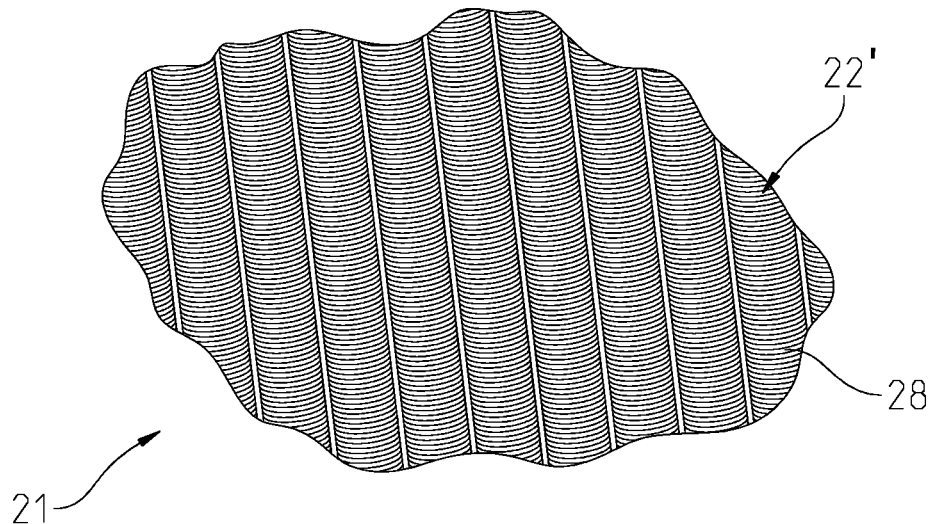

As described in the incorporated references, the wicking structure can be formed from a plurality of pillars, channels, grooves, trenches, or other geometric structures. For example, FIG. 2(A) illustrates an earlier TGP where a titanium wicking structure 22 is comprised of pillars 24. FIG. 2(B) illustrates an earlier TGP where a titanium wicking structure 22' is comprised of channels or grooves 28 on a substrate 21.

Figure 3A:
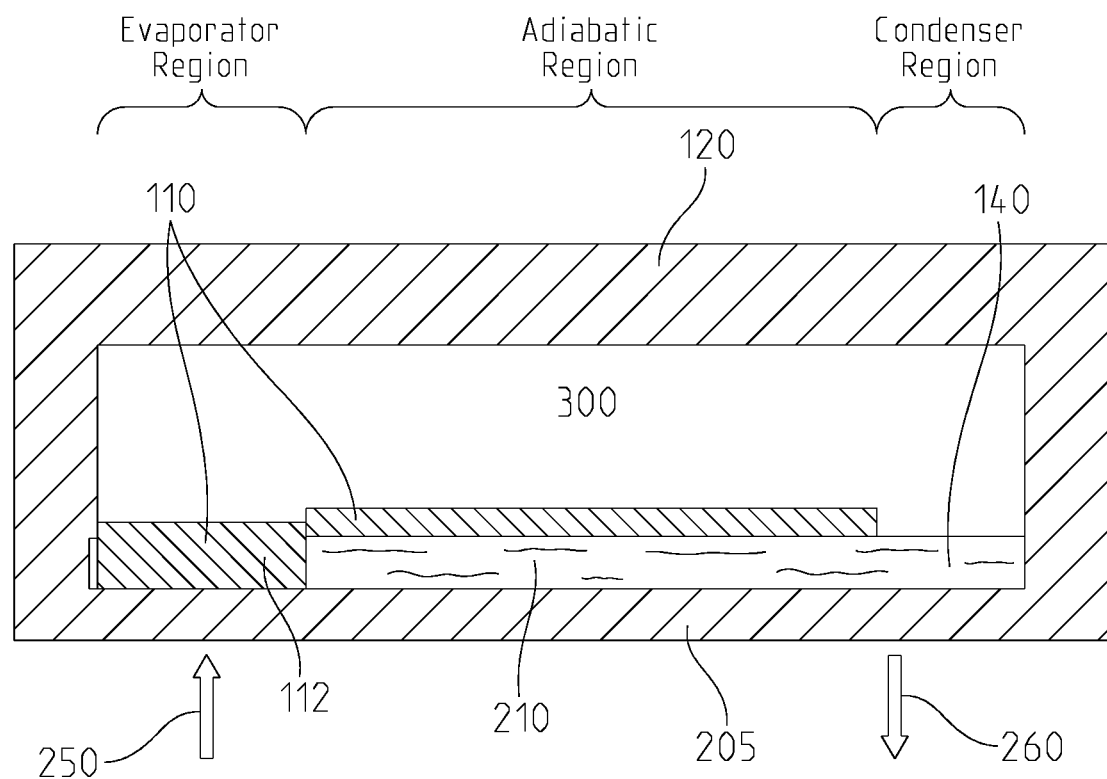
FIG. 3 is an illustrative embodiment of a metal-based thermal ground plane with an intermediate substrate in communication with a wicking structure and a vapor chamber. The intermediate layer could comprise microstructures. (A) shows a profile view depicting components of an embodiment, (B) shows an exploded view of structural components of an embodiment.
Figure 3B:
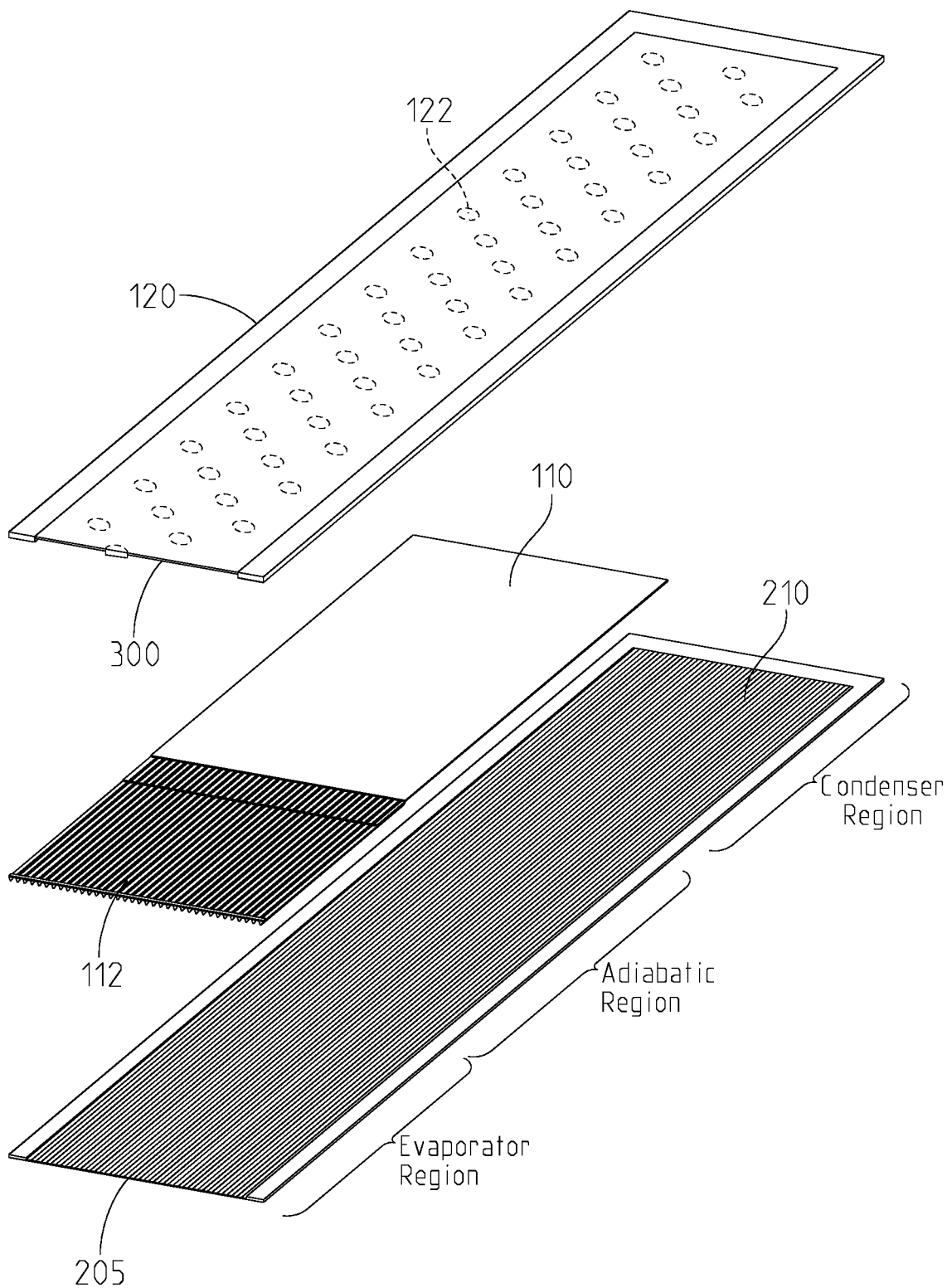

FIG. 3 illustrates an embodiment of a novel metal-based thermal ground plane with an intermediate substrate 110 in communication with a wicking structure 210 and a vapor chamber 300. The intermediate layer could comprise microstructures 112. FIG. 3(A) shows a profile view depicting components of an embodiment, while FIG. 3(B) shows an exploded view of structural components of an embodiment. The metal substrate 205 could be bonded to a metal backplane 120 to form a hermetically-sealed vapor cavity 300. The vapor cavity 300 may therefore be enclosed by the metal substrate 205 and the metal backplane 120. For example, in an embodiment, a titanium substrate could be pulsed laser micro-welded to a titanium backplane 120 to form a hermetically sealed vapor cavity.

In some embodiments, a plurality of intermediate substrates 110 could be used, where at least one different intermediate substrate 110 could be used for each different region of the thermal ground plane. The plurality of intermediate substrates 110 could be positioned in close proximity to each other to collectively provide overall benefit to the functionality of the thermal ground plane.

In some embodiments, the intermediate substrate 110 could contain regions that are comprised of a plurality of micro structures 112, with characteristic dimensions (depth, width, and spacing) ranging from 1-1000 micrometers. In some embodiments, the intermediate substrate 110 could contain regions that are comprised of a plurality of micro structures 112, with dimensions (depth, width, and spacing) ranging from 10-500 micrometers.

The at least one intermediate substrate 110 may contain regions that are comprised of a plurality of microstructures 112, regions that are comprised of solid substrates, and regions that are comprised of at least one opening in the at least one intermediate substrate 110 (that is large compared to the microstructures 112, and for example openings could range in dimension of 1 millimeter-100 millimeters, or 1 millimeter-1000 millimeters.

In some embodiments, the opening in the intermediate substrate 110 for chosen regions of the thermal ground plane could be achieved by simply not providing an intermediate substrate 110 in those regions. Thermal energy can be supplied by a heat source 250 and removed by a heat sink 260. Thermal energy can be transferred from one region (evaporator region) of the metal substrate 205 to another region (condenser region) of the metal substrate 205. In the evaporator region, the local temperature is higher than the saturation temperature of the liquid/vapor mixture, causing the liquid 140 to evaporate into vapor, thereby absorbing thermal energy due to the latent heat of vaporization.

The vapor residing in the vapor chamber 300 can flow from the evaporator region through the adiabatic region to the condenser region. The heat sink 260 could absorb heat from the condenser region causing the local temperature to be lower than the saturation temperature of the liquid/vapor mixture, causing the vapor to condense into the liquid phase, and thereby releasing thermal energy due to the latent heat of vaporization.

The condensed liquid 140 could predominantly reside in the wicking structure 210 and could flow from the condenser region through the adiabatic region to the evaporator region as a result of capillary forces.

As a result it could be advantageous for high-performance heat pipes to: (1) exhibit minimal viscous losses for the liquid 140 flowing through the wicking structure 210, and to (2) exhibit maximal capillary forces in the evaporator region. In many practical thermal ground plane embodiments, minimal viscous losses and maximal capillary forces are difficult to achieve simultaneously. Introducing an intermediate substrate 110 with a plurality of microstructures 112, configured as appropriate in each of the three regions could provide a means in which the thermal ground plane could have reduced viscous losses in some regions, while exhibiting increased capillary forces in other regions, compared to earlier TGP's with more or less the same structure over a majority of the interior.

In some embodiments, supporting pillars (standoffs) 122 are used to mechanically support the spacing between the backplane 120 and the wicking structure 210 and/or intermediate substrate 110. In some embodiments, the supporting pillars (standoffs) provide controlled spacing for the vapor chamber 300. The supporting pillars (standoffs) could be microfabricated using chemical wet etching techniques or other fabrication techniques (as described above). Accordingly, the backplane 120 may include standoffs that are in communication with the intermediate substrate and/or the metal substrate, for structurally supporting the thermal ground plane.

FIG. 4 depicts structural components of an embodiment where the different structural components are located in an evaporator region, an adiabatic region and a condenser region: (A) shows an evaporator region of an embodiment where the intermediate substrate 110 comprises a plurality of microstructures 112 that are positioned to increase the effective aspect ratio of the wicking structure 210. The fingers (microstructures 112) from the intermediate substrate 110 are interleaved with channels in the wicking structure 210, thereby creating double the number of higher aspect ratio features, compared to the lower aspect ratio features of the wicking structure 210 without the intermediate substrate 110. FIG. 4(B) shows an adiabatic region of an embodiment where the intermediate substrate 110 is positioned in close proximity to the wicking structure 210, and (C) shows a condenser region of an embodiment, where the wicking structure 210 is in direct communication with the vapor chamber 300. (D) shows the intermediate substrate 110 as a whole.

Accordingly, the thermal ground plane may have an evaporator region, an adiabatic region, and a condenser region. The intermediate substrate may have a different topography in the different regions, and in particular in the evaporator region relative to an adiabatic region.

Figure 4A:
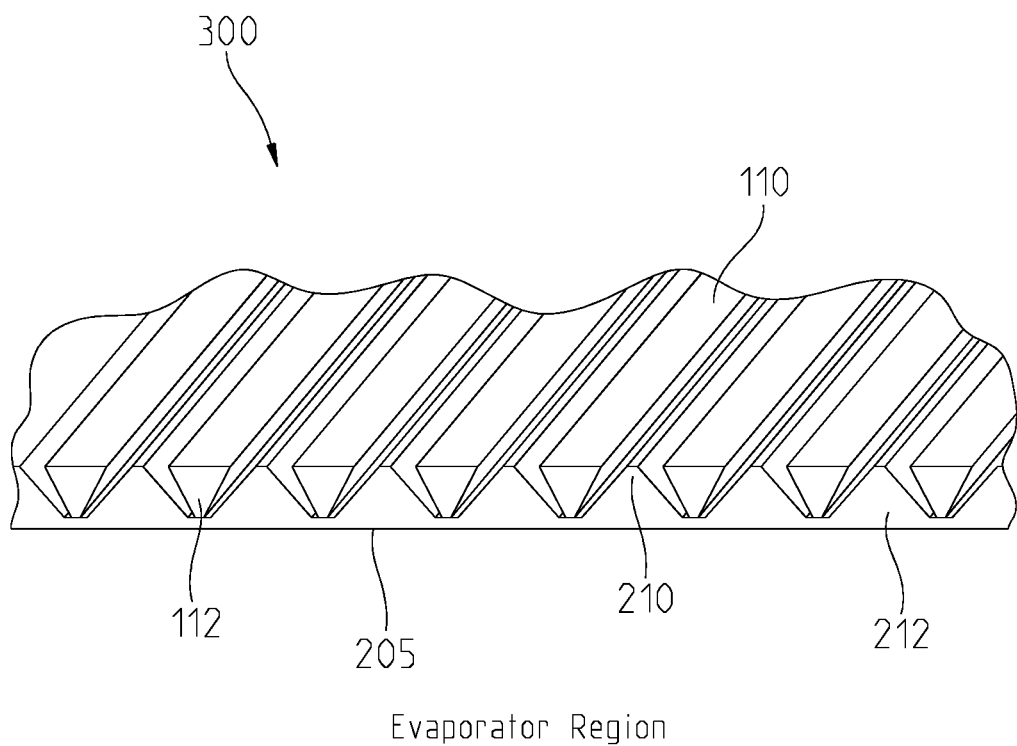
FIG. 4 depicts structural components according to an illustrative embodiment where the different structural components are located in an evaporator region, an adiabatic region and a condenser region: (A) shows an evaporator region of an embodiment where the intermediate substrate comprises a plurality of microstructures that are interleaved with the wicking structure, (B) shows an adiabatic region of an embodiment where the intermediate substrate is positioned in close proximity to the wicking, (C) shows a condenser region of an embodiment where the wicking structure is in direct communication with the vapor chamber, and (D) shows detail of an embodiment of an intermediate substrate.

FIG. 4(A) depicts an embodiment where the intermediate substrate 110 comprises a plurality of microstructures 112 that are interleaved with the wicking structure 210 of the metal substrate 212. By interleaving the microstructures 112 of the intermediate substrate with the wicking structure 210 of the metal substrate 212, the interface between the solid and liquid can be substantially increased. This could increase the capillary forces that are applied to the liquid, and could increase the amount of heat transferred from the metal solid to the liquid.

Figure 4B:
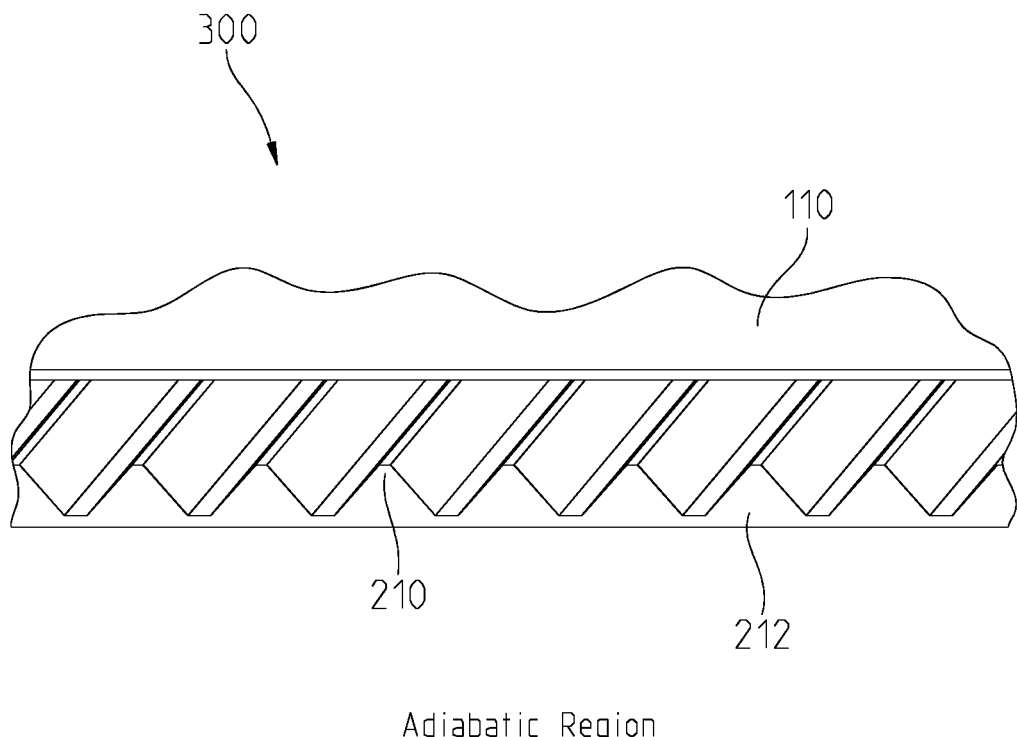

FIG. 4(B) shows an adiabatic region of an embodiment where the intermediate substrate 110 is positioned in close proximity to the wicking structure 210. A solid intermediate substrate 110 could be used to isolate the vapor chamber 300 from the wicking structure 210. By isolating the vapor chamber 300 from the wicking structure 210, the solid-liquid interface area could be increased, and the liquid could fill substantially the wicking structure 210, without a meniscus occupying the channel, and which could provide a higher mass flow rate for the liquid with less viscous pressure drop, compared to the earlier TGP's where the liquid in the wicking structure 210 could be exposed directly to the vapor in the vapor chamber 300 with a meniscus residing at the liquid/vapor interface.

Figure 4C:
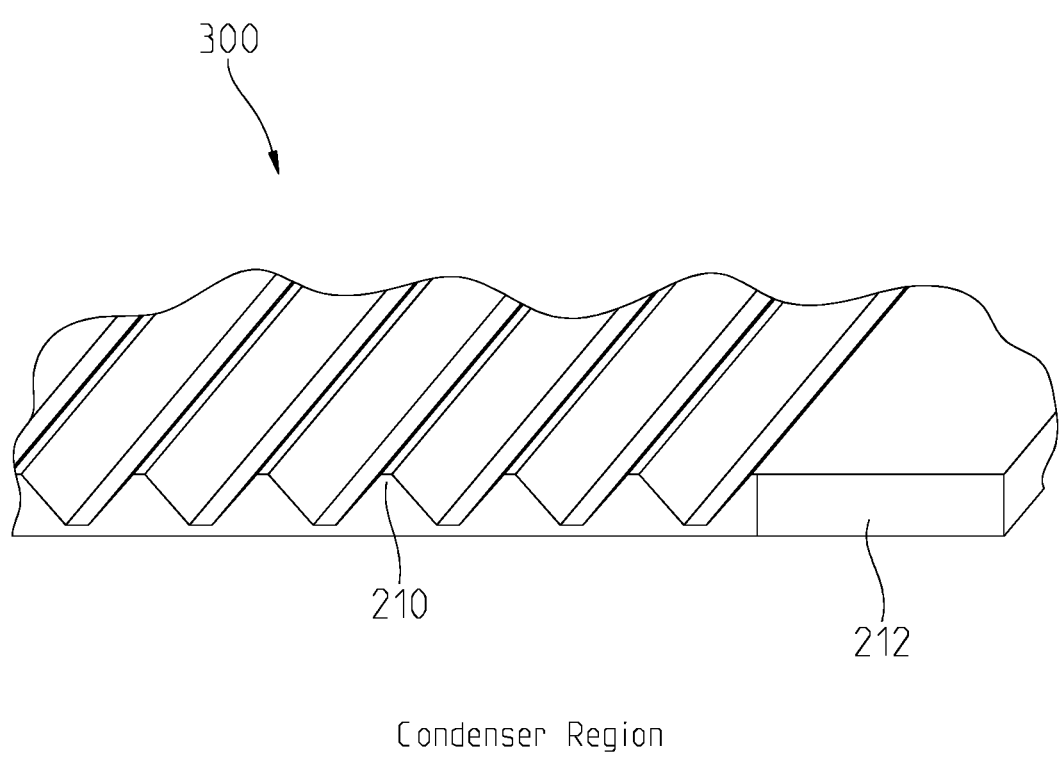
Figure 4D:
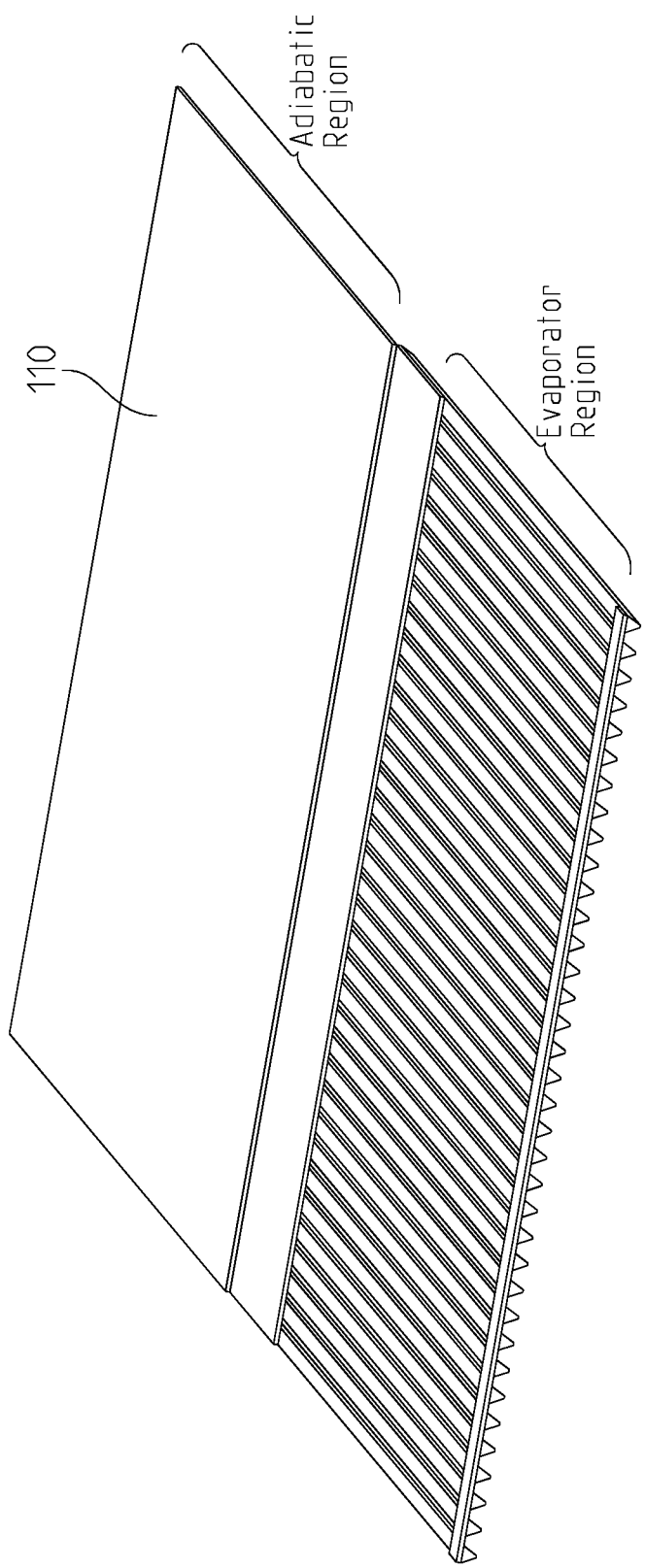

FIG. 4(C) shows a condenser region of an embodiment where the wicking structure 210 is in direct communication with the vapor chamber 300. When the wicking structure 210 is in direct communication with the vapor chamber 300, vapor could more easily condense onto the wicking structure 210. Furthermore, in regions, such as the condenser, there might not be significant differences in pressure between the liquid and vapor phases, and an intermediate substrate 110 may not provide significant advantages.

However, in other embodiments, if the condenser region was relatively large and there was significant pressure difference between the liquid and vapor phases, an intermediate substrate 110 could provide advantages in the condenser region as well.

FIG. 4 (D) shows an illustrative embodiment of an implementation of an intermediate substrate 110 as described above. The evaporator region of the intermediate substrate 110 includes rows of wedge shaped fingers supported across each end, such that when the TGP is assembled, the fingers interleave with the substrate wicking microstructures 112 as shown in FIG. 4(A), where the interleaved structures are exposed to the vapor chamber 300. The adiabatic region of the intermediate substrate 110 is a cover that overlays a portion of the wicking microstructures 112, as shown in FIG. 4(B). The condenser region may not require an intermediate substrate 110 component in some embodiments, as shown in FIG. 4(C).

The aspect ratio is commonly defined as the ratio of one major dimension of a structure to another major dimension of a structure. For pillars, channels, trenches, grooves or other features used in heat pipe applications, the effective aspect ratio may refer to the ratio between the height and the width of the region occupied by a fluid, such as a liquid 140 flowing through a wicking structure 210. In some embodiments, the intermediate substrate 110 may include one section (as shown by example in FIG. 4(A)) that in combination with the wicking structure 210 provides an effective aspect ratio that is substantially higher than the aspect ratio provided only by the wicking structure 210. In other words, the intermediate substrate 110 may have a region with a plurality of protrusions that fit conformally into the wicking structure 210, to form narrow fluid passages through which the fluid is driven by capillary forces. The protrusion may be shaped to fit into features in the wicking structure 210, as shown in FIG. 4(A).

For some desirable micromachining processes, such as wet chemical etching, it may be difficult to achieve a high aspect ratio in the wicking structure 210. Interleaving two structures may achieve a higher aspect ratio in the wicking structure, than could otherwise be achieved using a single wet-etched structure. As shown by example in FIG. 4(B), the intermediate substrate 110 may include another section that is a cap on the wicking structure 210 to minimize viscous losses, isolate the liquid from the vapor that is in close proximity above, and improve flow volume. It may be the case that the intermediate substrate 110 arranged so that the portions of the wicking structure 210 remain uncovered by the intermediate substrate 110. This may be in the condenser region as shown in FIG. 4(C) or could also be in the evaporator region so the wicking structure in either the evaporator region and/or condenser region remain uncovered. The arrangement shown in FIG. 4(C) facilitates direct communication with the evaporator region of the condenser region depending on where the arrangement in FIG. 4(C) is located. Accordingly, the openings of the intermediate substrate may be substantially more open than said microstructures, so the wicking structure and vapor chamber could be in direct communication, in at least one region of the thermal ground plane.

Thus, the addition of the intermediate substrate 110 allows for optimization of the wicking structure 210 in each of the three operational regions of the cooling device, and in a way that could be compatible with micromachining processes, such as wet etching techniques, and assembly techniques.

Without loss of generality, the wicking structure 210 could be formed by dry etching, wet chemical etching, other forms of micromachining, macromachining, sawing with a dicing saw, and many other types of processes. In some embodiments, dry etching could provide high aspect ratio channels, where the depth is comparable or perhaps even larger than the width of the channels. However, dry etching may be limited to smaller regions and may not be desirable for large-scale manufacturing, compared to wet etching processes. Mask-based wet etching could be desirable as it could be applicable to relatively large etch regions, could be cost effective, and could be compatible with high-volume manufacturing. In some embodiments, photolithography-based methods could be used to dry or wet etching.

In some embodiments the wicking structure 210 could be formed by standard wet chemical etching techniques. In some embodiments, wet chemical etching can limit the aspect ratio, which is the ratio of the wicking channel depth to the wicking channel width. In some embodiments that use wet etching, the wicking channel width can be at least 2 to 2.5 times wider than the wicking channel etch depth. In some embodiments, where the wicking channel width is at least 2 to 2.5 times wider than the wicking channel etch depth, there could be significant disadvantages to low aspect ratio wicking channels.

The pressure between the vapor and liquid phases can be described by the Laplace pressure, $\Delta P = P_v - P_l = 2\gamma/R$, where $P_v$ is the vapor pressure, Pl is the liquid pressure, $\gamma$ is the surface tension, and R is the radius of curvature of the surface. A high pressure difference between the liquid and vapor phases could be obtained by decreasing the radius of curvature, R.

Generally, a smaller radius of curvature can be achieved by having material surfaces that exhibit low contact angles, and by forming geometries with relatively small geometric dimensions. In many embodiments, it may be desirable to have low viscous losses for the liquid flowing through the wicking structure 210. Small geometric dimensions in the wicking structure 210 can significantly increase the viscous losses of liquid flowing through the wicking structure 210. Therefore, in some embodiments, it may be difficult to achieve low viscous losses, and have a meniscus with a small radius of curvature that can support a high pressure difference between the vapor and liquid phases. The current application discloses a means in which some embodiments can be configured for maximum capillary forces to support large pressure differences between the liquid and vapor phases, for example in the evaporator region. The current application discloses a means in which some embodiments can be configured to minimize viscous losses of the liquid flowing in the wicking structure 210, by using different structures in the different regions.

FIG. 5 shows profile views of structural components of an illustrative embodiment where the structures are non-wetted (i.e. dry) and are wetted by a liquid: (A) non-wetted structural components in the evaporator region, (B) wetted structural components in the evaporator region, (C) non-wetted structural components in the adiabatic region, (D) wetted structural components in the adiabatic region, (E) non-wetted structural components in the condenser region, (F) wetted structural components in the condenser region.

Figure 5A:
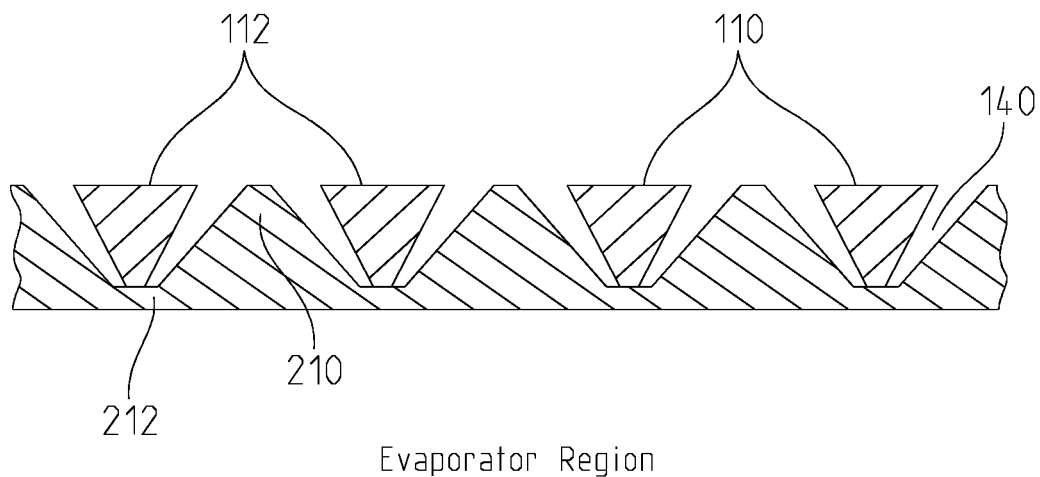
FIG. 5 is an illustrative embodiment of profile views of structural components of an embodiment where the structures are non-wetted (i.e. dry) and wetted by a liquid: (A) non-wetted structural components in the evaporator region, showing where the liquid collects (B) non-wetted structural components in the adiabatic region, (C) wetted structural components in the adiabatic region, (D) non-wetted structural components in the condenser region, showing where the liquid collects.

FIG. 5(A) shows a profile view of an illustrative embodiment where the intermediate substrate 110 comprises a plurality of microstructures 112 that are interleaved with the wicking structure 210 of the metal substrate 212.

The plurality of microstructures 112 are interleaved with the wicking structure 210 of the metal substrate 212, and where the micro structures 112 and wicking structure 210 are wetted by a liquid 140.

By interleaving the microstructures 112 of the intermediate substrate 110 with the wicking structure 210 of the metal substrate 212, the interface area between the solid and liquid 140 could be substantially increased. This could increase the capillary forces that are applied to liquid 140, and could increase the amount of heat transferred from the metal solid to liquid 140.

Figure 5B:
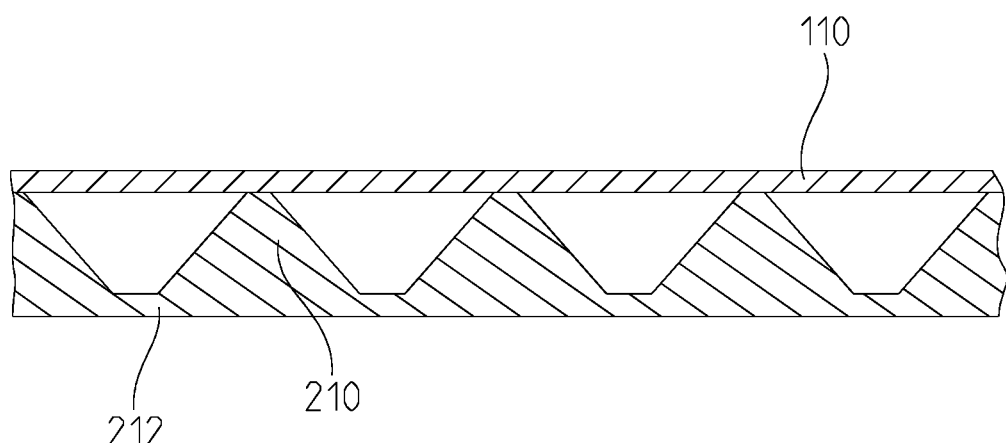

FIG. 5(B) shows the meniscus 180 at the liquid-vapor interface. In some embodiments, gaps between the plurality of micro structures 112 contained in the intermediate substrate 110 and the wicking structure 210 could be formed so that they are substantially smaller than the depth of the wicking structure 210. In some embodiments the relatively small gaps between the plurality of micro structures 112 contained in the intermediate substrate 110 and the wicking structure 210 could provide effectively higher aspect ratio wicking channels, compared to some embodiments where the wicking structure 210 is formed by wet etching a single metal substrate 212 (as is common, and depicted in FIG. 4(C)).

In some embodiments, titanium could be used as a substrate material. The thermal conductivity of titanium is approximately hi=20 W/(m K), and liquid water is approximately, kw=0.6 W/(m K). Since the thermal conductivity of titanium is approximately 30 times higher than liquid water, the intermediate substrate 110 can provide additional thermal conduction pathways, which can decrease the thermal resistance between the outside surface of the thermal ground plane and liquid 140 located in the wicking structure 210. Furthermore, the microstructures 112 contained within the intermediate substrate 110 could increase the solid-liquid interface area, which could decrease the thermal resistance, and increase the critical heat flux that can occur, between titanium solid and liquid 140.

In some embodiments, the combination of the wicking structure 210 and the intermediate substrate 110 can effectively increase the aspect ratio of the channels in the wicking structure 210. Under very large pressure differences between the liquid and vapor phases, the meniscus 180 may be pushed down and not wet the top of the wicking structure 210. However, in some embodiments, the shape of the composite wicking structure 210 formed by interleaving the microstructures 112 of the intermediate substrate 110 with the wicking structure 210 may be chosen such that under large pressure differences across the meniscus 180, there is only a partial dryout (or at least dryout could be substantially delayed) of the wicking structure 210 (so that the TGP continues to function), and the thermal ground plane does not undergo catastrophic dryout.

In previous two-phase heat transfer devices, instabilities can occur due to evaporation and/or boiling as the liquid phase is converted to the vapor phase. These instabilities can cause local dryout of the wicking structure 210 and can degrade the performance of the thermal ground plane. These instabilities can be substantially decreased in some of the current embodiments. For example, in some embodiments, the shape of the wicking structure 210 formed by interleaving the micro structures 112 of the intermediate substrate 110 with the wicking structure 210 may be chosen such that there can be substantial viscous resistance to liquid flow in the wicking structure 210. This viscous resistance can be advantageous as it can increase the stability of the evaporation and/or boiling process that may occur in the evaporator.

FIG. 5(B) shows a profile view an adiabatic region of an illustrative embodiment, where the intermediate substrate 110 is positioned in close proximity to the wicking structure 210. In some embodiments, the intermediate substrate 110 could be placed directly above the wicking structure 210. In some embodiments, the intermediate substrate 110 could be comprised of micro structures 112. In some embodiments, a solid intermediate substrate 110 could be used to isolate the vapor chamber 300 from the wicking structure 210. By isolating the vapor chamber 300 from the wicking structure 210, the solid-liquid interface area could be increased, and the liquid 140 could substantially fill the wicking structure 210, which could provide a higher mass flow rate of the liquid with less viscous pressure drop, compared to earlier wicking structures 210.

Figure 5C:
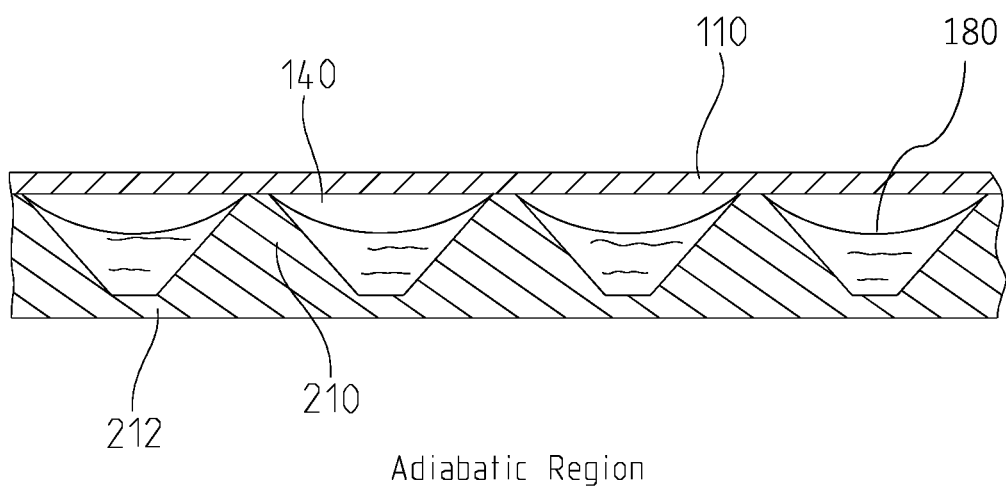

FIG. 5(C) shows a profile view of an adiabatic region of an illustrative embodiment, where the intermediate substrate 110 is positioned in close proximity to the wicking, and where liquid 140 is in the wicking structure 210. A solid intermediate substrate 110 could be used to isolate the vapor chamber 300 from the wicking structure 210. By isolating the vapor chamber 300 from the wicking structure 210, the solid-liquid interface area could be increased, and the liquid 140 could fill substantially the wicking structure 210, which could provide a higher mass flow rate for the liquid with less viscous pressure drop, compared to earlier wicking structures 210.

In some embodiments, where high-performance thermal energy transfer is desired, it may be important to decrease viscous losses of the liquid in the adiabatic region. In some embodiments, an intermediate substrate 110 could be used to isolate the vapor chamber 300 from the liquid 140 in the wicking structure 210. In some embodiments, where there is a large difference in pressure between the vapor and the liquid in the wicking structure 210, the vapor chamber 300 can be isolated from the liquid in the wicking structure 210 by a solid intermediate substrate 110, which could prevent the high difference in pressure from negatively affecting liquid flow in the wicking structure 210.

In earlier TGPs, wet-etched wicking channels could have low aspect ratios (i.e. low ratio between the channel height to the channel width). In some embodiments, if there is a large pressure difference between the vapor and liquid phases, the liquid phase may not completely fill the wicking channel, and the liquid 140 flow through the wicking structure 210 could be negatively impacted, and could lead the dryout of the wicking channel. In some embodiments of the current disclosure, an intermediate substrate 110 could be used to isolate the vapor chamber 300 from liquid 140 contained in the wicking structure 210, and could delay or even prevent dryout of the wicking structure 210. The liquid 140 may collect in the narrow regions, as shown in FIG. 5(D), and a meniscus (not shown) may form at the bottom and adjacent to the sides of the wicking structure 210.

Figure 5D:
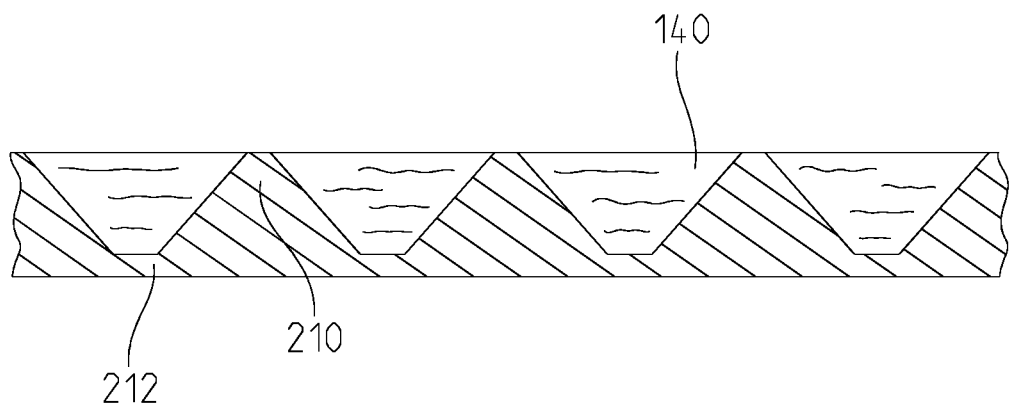

In FIG. 5(D) the wicking structure 210 may be in direct communication with the vapor chamber 300. When the wicking structure 210 is in direct communication with the vapor chamber 300, vapor could condense more readily onto the wicking structure 210. Furthermore, in regions, such as the condenser, there might not be significant differences in pressure between the liquid and vapor phases, and an intermediate substrate 110 may not provide significant advantages. However, for a case where the condenser region is large, significant differences in pressure between the liquid phase and the vapor phase could exist and accordingly, the condenser region could conceivably benefit from at least one intermediate substrate 110 with microstructures 112, whose effect is to increase the aspect ratio of the wicking structure 210, thereby shortening the meniscus 180 length and thus increasing the amount of pressure that the meniscus 180 can support, as described above for the evaporation region. As shown in FIG. 5(D), liquid 140 may collect in the trenches of the wicking structure 210.

As shown in FIG. 5(D), the wicking structure 210 may be in direct communication with the vapor chamber 300, such that the wicking structure 210 is wetted by a liquid 140. In some embodiments, there may not be a significant difference in pressure between the vapor chamber 300 and the liquid 140 in the wicking structure 210, and an intermediate substrate 110 may not provide significant advantages. However, for a case where the condenser region is large, significant pressure difference between the liquid phase and the vapor phase could exist and accordingly, the condenser region could conceivably benefit from microstructures 112 whose effect is to increase the aspect ratio of the wicking structure 210 and increase the amount of pressure that the meniscus can support, as described above for the evaporation region.

Figure 6:
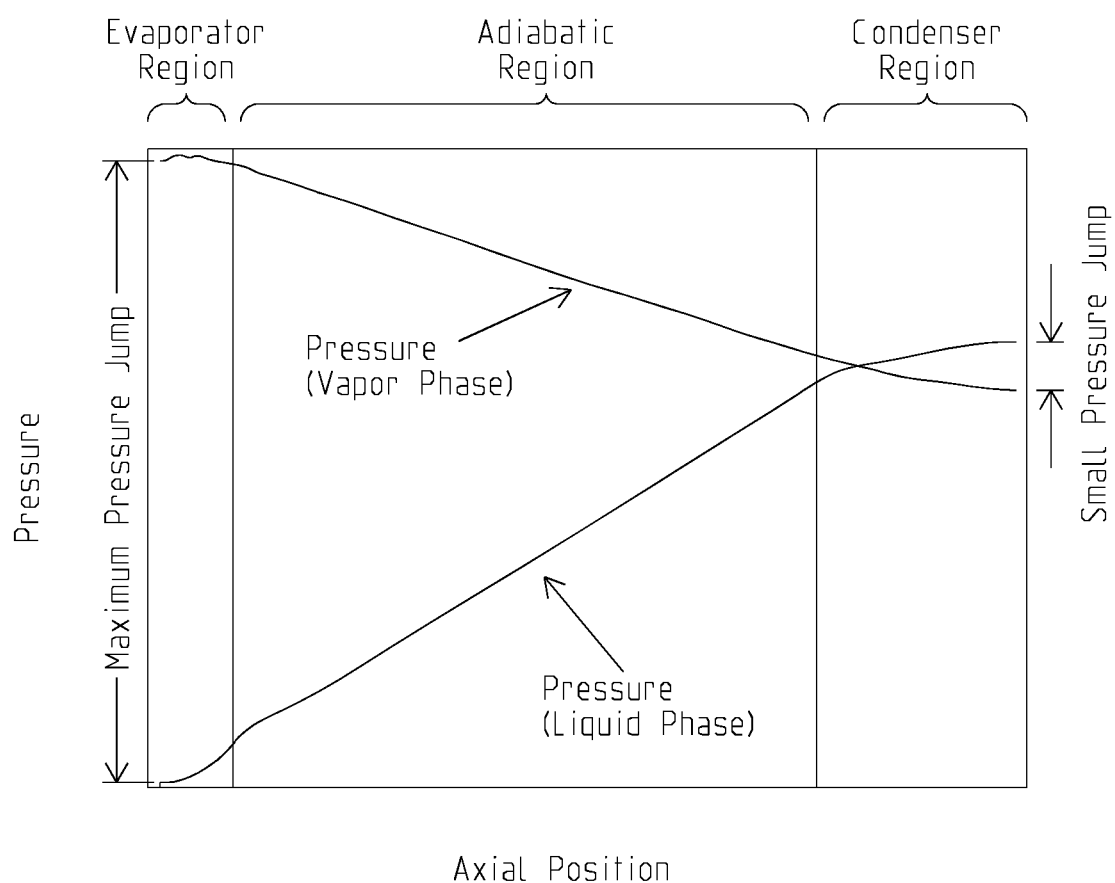
FIG. 6 shows pressure profiles as a function of axial location for an illustrative embodiment of a thermal ground plane. The curves show the pressure of the vapor phase in the vapor chamber and the liquid phase in the wicking structure. In this case, the maximum pressure difference between the liquid and vapor phases occurs in the evaporator region. The minimum pressure difference between the vapor and liquid phases occurs in the condenser region.

FIG. 6 shows pressure profiles as a function of axial location for an illustrative embodiment of a thermal ground plane. The curves show the pressure of the vapor phase in the vapor chamber 300 and the liquid phase in the wicking structure 210. In an illustrative embodiment, the maximum pressure difference between the liquid and vapor phases could occur in the evaporator region. In an illustrative embodiment, the minimum pressure difference between the vapor and liquid phases could occur in the condenser region.

Wicking structures 210 may be comprised of channels, pillars, or other structures. If these structures are formed by wet etching or other fabrication processes, they may be comprised of features with low aspect ratios. Earlier wicking structures 210 could be comprised of low-aspect ratio channels or pillars, and did not include an intermediate structure. In these earlier low-aspect ratio wicking structures 210, a large pressure difference between the liquid phase and the vapor phase could cause the meniscus 180 between the two phases to extend towards the bottom of the channel, thereby decreasing the amount of liquid 140 occupying the channel and significantly decreasing the mass flow of the liquid. This in turn could cause poor heat transfer performance and possible dryout of the wicking structure 210.

As shown in FIG. 6, the highest vapor pressure typically occurs in the evaporator region, and the vapor pressure, due to viscous losses, increases with the amount of heat transferred by the TGP. Further, it may be desirable to make the overall thickness of the thermal ground plane as thin as practically possible, which might be accomplished by making the vapor chamber 300 relatively thin. A relatively thin vapor chamber 300 could cause substantial viscous losses of the vapor flowing in the vapor chamber 300 from the evaporator through the adiabatic region to the condenser. High viscous losses of vapor flowing in the vapor chamber 300 can also contribute to a large difference in pressure between the liquid and vapor phases in the evaporator. An intermediate substrate 110 structure, which increases the aspect ratio of the wicking structure 210, as described above, has the effect of decreasing the meniscus 180 length of the liquid/vapor interface, making the radius of curvature smaller, in this part of the wicking structure 210, thereby making the meniscus 180 more resistant to high meniscus 180 pressure (FIG. 5(B)) and making the TGP capable of supporting much higher pressures than previous implementations. Accordingly, at least one region of the at least one intermediate substrate may have a plurality of microstructures that are interleaved with at least one region of the wicking structure to form high aspect ratio wicking structures, in at least one region of the thermal ground plane. Furthermore, at least one intermediate substrate may be in close proximity to the wicking structure, to isolate the liquid phase and vapor phase, in at least one region of the thermal ground plane.

Supporting higher pressure differences between the liquid phase and the vapor phase allows for more heat to be transferred without drying out the wicking structure 210 as well as making the TGP more resistant to viscous losses resulting from thinner designs. Thus, the addition of the intermediate substrate 110 may achieve both higher heat transfer and thinner ground planes, simultaneously.

In some embodiments, the thermal ground plane could be filled with a specified mass of saturated liquid/vapor mixture such that difference in pressure between the vapor and liquid phases in the condenser is well controlled. In some embodiments the mass of the liquid/vapor mixture could be chosen so that part of the condenser region could contain liquid at a higher pressure than adjacent vapor.

An earlier titanium thermal ground plane might only be capable of transferring about 10 W of thermal energy before the wicking structure 210 exhibits dryout at an operating vapor temperature of 30° C., compared to 30 W for an illustrative embodiment of the current thermal ground plane using an intermediate substrate 110. Similarly, as vapor temperature is increased, the maximum thermal energy transferred for an illustrative embodiment of the current thermal ground plane is increased to 35 W and 40 W, for operating vapor temperatures of 50° C. and 70° C., respectively. In all cases, the maximum thermal energy transferred for an illustrative embodiment of the current thermal ground plane is 15-20 W more than what is observed from an earlier thermal ground plane.

Figure 7:
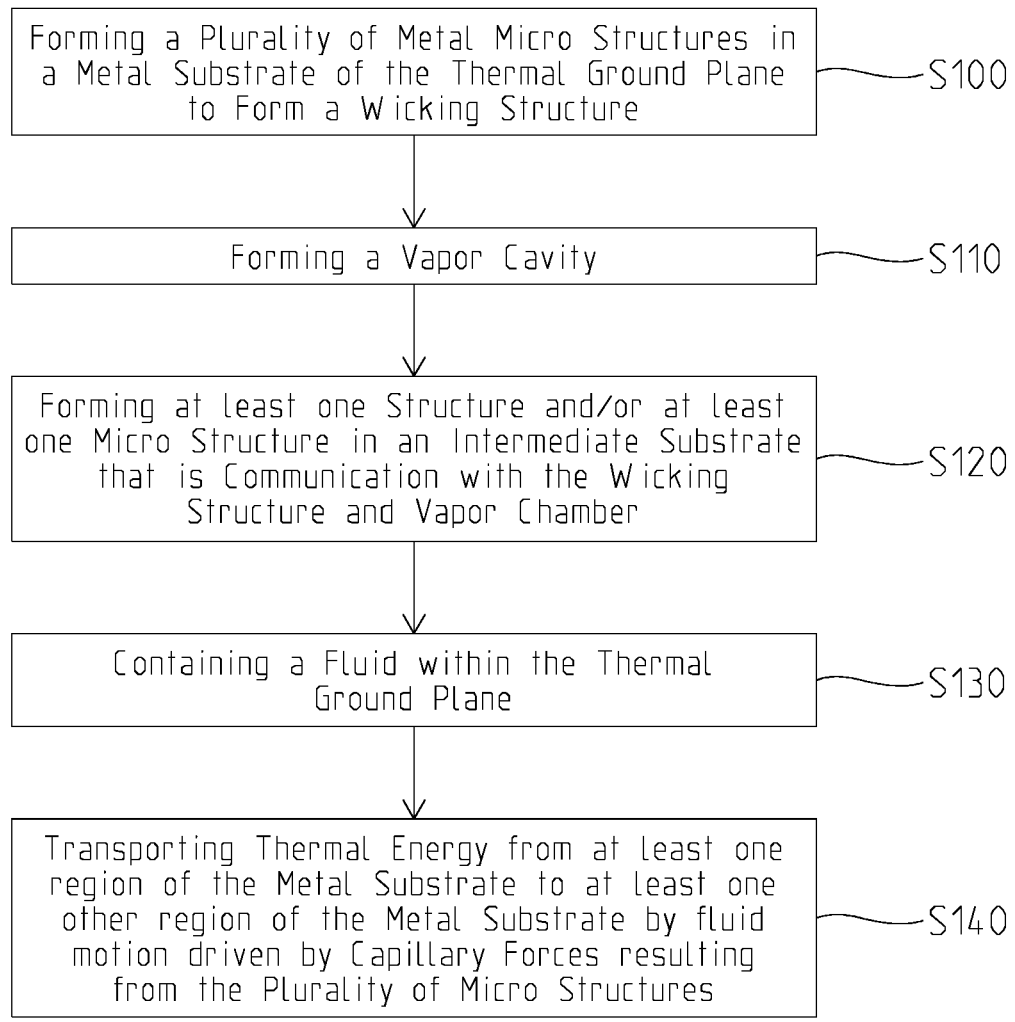
FIG. 7 is an illustrative embodiment of a flow chart of the formation of one or more embodiments of the current Ti-based TGP (metal-based Thermal Ground Plane) in accordance with one or more embodiments.

FIG. 7 illustrates a flow chart of the formation of one or more embodiments of the current Ti-based TGP in accordance with one or more embodiments of the present invention. In some embodiments, thermal energy can be transported by (1) forming a plurality of metal micro structures in a metal substrate of the thermal ground plane to form a wicking structure in step S100. In step S110, a vapor cavity may be formed. In step S120, at least one structure and/or at least one microstructure is formed in an intermediate substrate that is communication with the wicking structure and vapor chamber, wherein the intermediate substrate is shaped and positioned to increase the effective aspect ratio of the wicking structure in at least one region of the wicking structure. In step S130, a fluid may be contained within the thermal ground plane. In step S140, thermal energy may be transported from at least one region of the metal substrate to at least one other region of the metal substrate by fluid motion driven by capillary forces, resulting from the plurality of microstructures.

Figure 8:
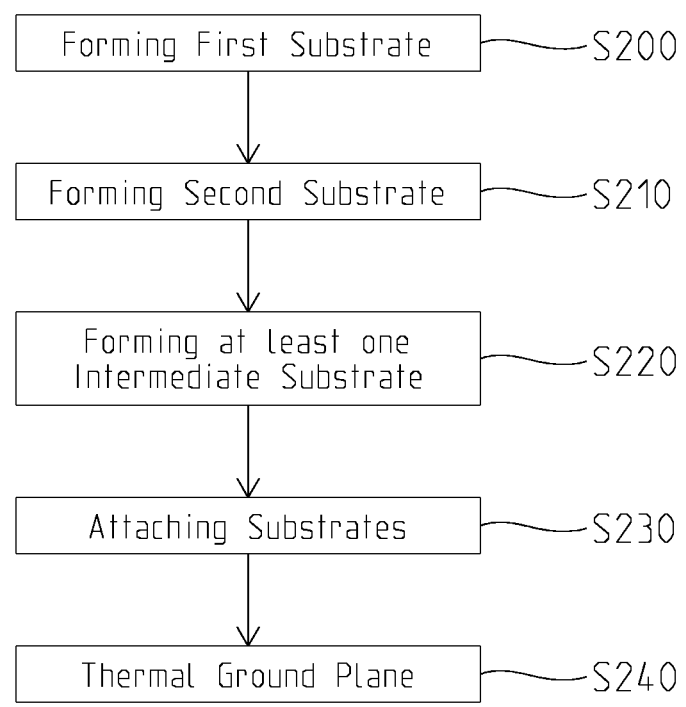
FIG. 8 is an illustrative embodiment of a flow chart of the formation of one or more embodiments of the current Ti-based TGP.

FIG. 8 illustrates a flow chart of the formation of one or more embodiments of the current Ti-based TGP in accordance with one or more embodiments of the present invention. In some embodiments a metal-based thermal ground plane can be formed by the following process. In step S200, the first substrate is formed. In step S210, a second substrate is formed. In step S220, at least one intermediate substrate is formed. In step S230, the substrates are attached. In step S240, the thermal ground plane is formed.

Figure 9A:
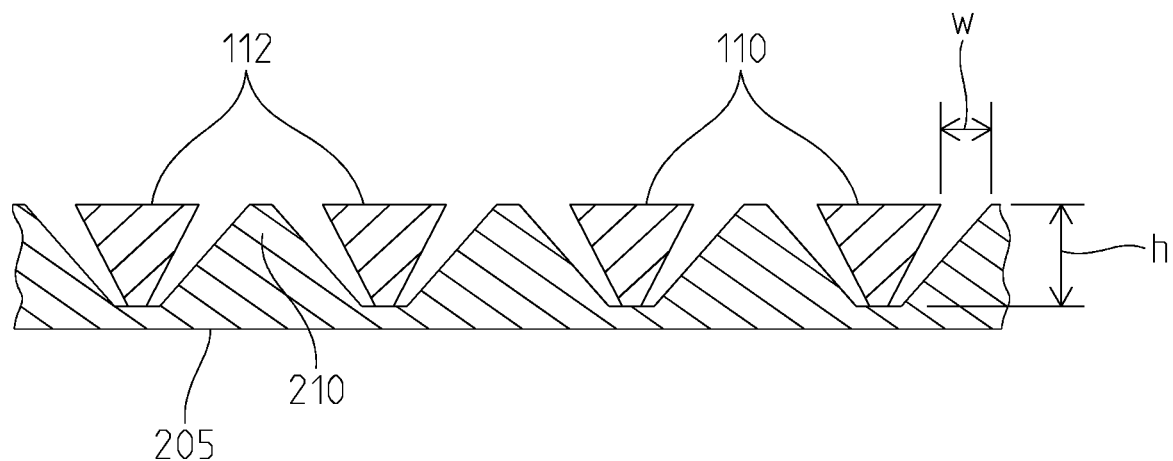
FIG. 9 shows illustrative embodiments of a wicking structure in communication with an intermediate substrate. The effective aspect ratio is defined as the ratio of the effective channel height, h, to the effective channel width, w: (A) shows an illustrative embodiment where the microstructures in the intermediate substrate are interleaved with the wicking structure, (B) shows an alternative embodiment where the microstructures in the intermediate substrate are positioned above the wicking structure.

FIG. 9 shows illustrative embodiments of a wicking structure 210 in communication with an intermediate substrate 110. The effective aspect ratio is defined as the ratio of the effective channel height, h, to the effective channel width w: (A) shows an illustrative embodiment where the micro structures 112 of the intermediate substrate 110 are interleaved with the wicking structure 210, (B) shows an alternative embodiment where the microstructures 112 of the intermediate substrate 110 are positioned above the wicking structure 210.

The illustrative embodiments shown in FIG. 9 could provide effective aspect ratios that are higher than what might be obtained by the wicking structure 210 without including an intermediate substrate 110. For example, if the wicking structure 210 is formed by a wet etching or other isotropic etching process, the aspect ratio h/w may be less than unity, or substantially less than unity. Using an intermediate substrate 110, higher effective aspect ratios of the fluid channel between the wicking structure 210 and the intermediate substrate 110, may be achieved. For example, in some embodiments, h/w>1 wherein h is the effective height (or depth) of the fluid channel and w is the width.

Figure 9B:
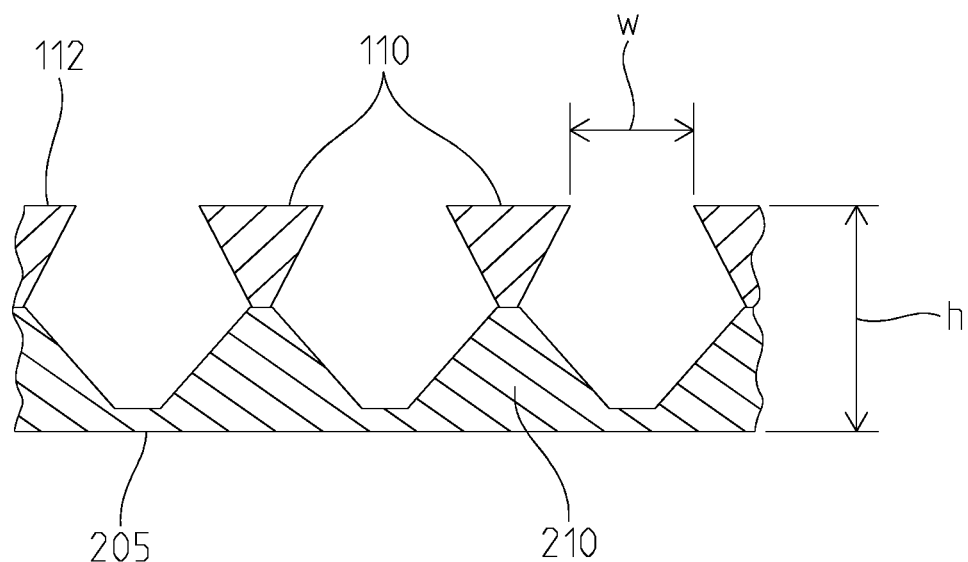

FIG. 9(B) shows an alternative embodiment, which could have advantages when relatively low viscous losses are desirable.

Because it is robust, effective, small and shock resistant, two-phase cooling devices, such as Thermal Ground Planes (TGPs) may be especially suited to mobile or portable applications. For example, the titanium based thermal ground plane (TiTGP) described above may be adapted for use in a portable devices, to increase robustness and efficiency and decrease size and cost. One such device commonly used is known as a smartphone. However, the structures described here may also be applied to other mobile computing and/or communicating devices such as laptops, cards and tablets, smartphones, and head-mounted devices.

Figure 10:
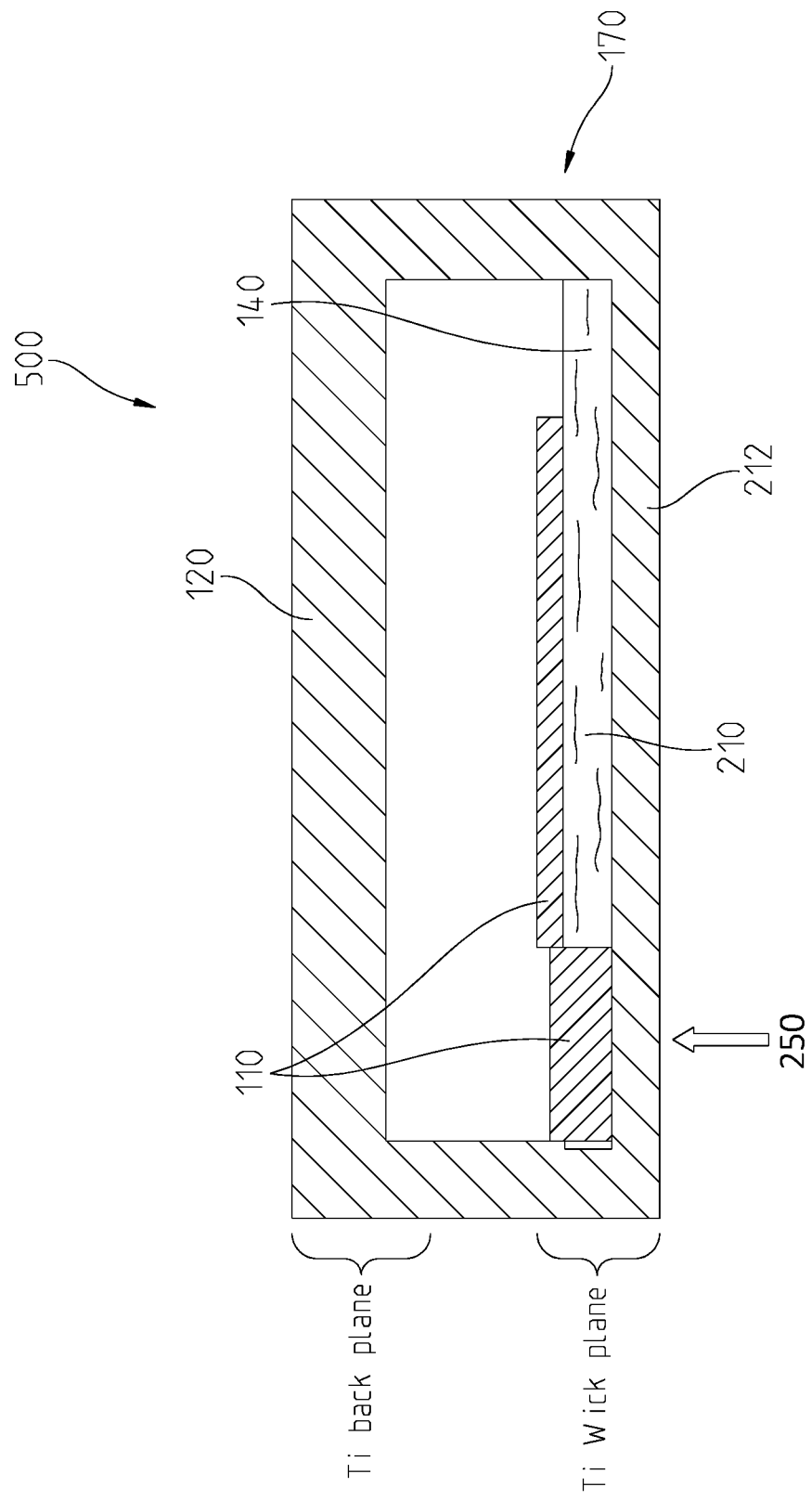
FIG. 10 is a simplified cross-sectional view of a TiTGP for a portable device.

A simplified cross-sectional view of the titanium based thermal ground plane, as adapted for the portable application, is shown in FIG. 10. The titanium based thermal ground plane maybe be generally of the same structure as shown previously with respect to FIGS. 1, 3 and 5. However, one important difference is that instead of an evaporator region, adiabatic region and condenser region shown in FIG. 3, the condenser region (and heat sink) may be absent. Instead, heat is transferred by the convection currents in the vapor. Thus, the TiTGP for portable may operate entirely in a vapor mode such that the vapor never actually condenses into a liquid in a distinct region because of the temperatures and space constraints involved. As result there is simply the heat source 250, which is the integrated circuit 450, which applies heat to the wicking structure 210. The heat vaporizes the liquid in the vapor chamber 300. The vapor eventually reforms as a liquid in the far right region of the thermal ground plane shown in FIG. 10. The liquid is then returned to the heat source by a wicking structure. Such a TiTGP can dissipate at least about 5 W when operating in this mode, and so is capable of dissipating the 2-3 W generated by the IC 450.

It should be understood that the term "two-phase cooling devices" and "thermal ground plane" are used interchangeably herein. Either term may designate the titanium-based thermal ground plane (TiTGP) described above with respect to FIGS. 1-10.

The wick structure 210 shown in FIG. 10 may be the wick structure described earlier in FIGS. 1-4 for example. The wicking structure 210 may contain any of the options described above with respect to wicking structure 10 and 210 and in FIGS. 1, 3, 4, and 5, for example. In particular, the wicking structure 210 may include at least one region having a plurality of microstructures 112 with characteristic dimensions of 1-1000 micrometers. The wicking structure 210 may further include a plurality of microstructures that are interleaved with at least one region of the wicking structure to form high effective aspect ratio wicking structures, in at least one region of the thermal ground plane. Within the wicking structure 210, a liquid phase and a vapor phase, may each exist within in a separate region within the thermal ground plane. The thermal ground plane may have an intermediate substrate with protrusions as described previously. Possible shapes, sizes and aspect ratios have been described previously, which may form narrow channels. For ease and clarity of illustration, these details are not shown in FIGS. 13-18 and instead, the TiTGP is shown generically as comprising a wicking structure 210 or 510 and a backplane 520.

Accordingly, the thermal ground plane 500 is depicted as having two basic components, a titanium backplane 520 and the titanium based wick plane 510. The generic wicking structure 510 should be understood to include any or all of the previously described features, such as an intermediate substrate, microstructures, standoffs, and metal substrates as described with respect to FIGS. 1-9. The backplane 520 and the wicking structure 510 may be joined by a laser weld as described previously. The total thickness of these regions is on the order of 0.5 mm.

Figure 11:
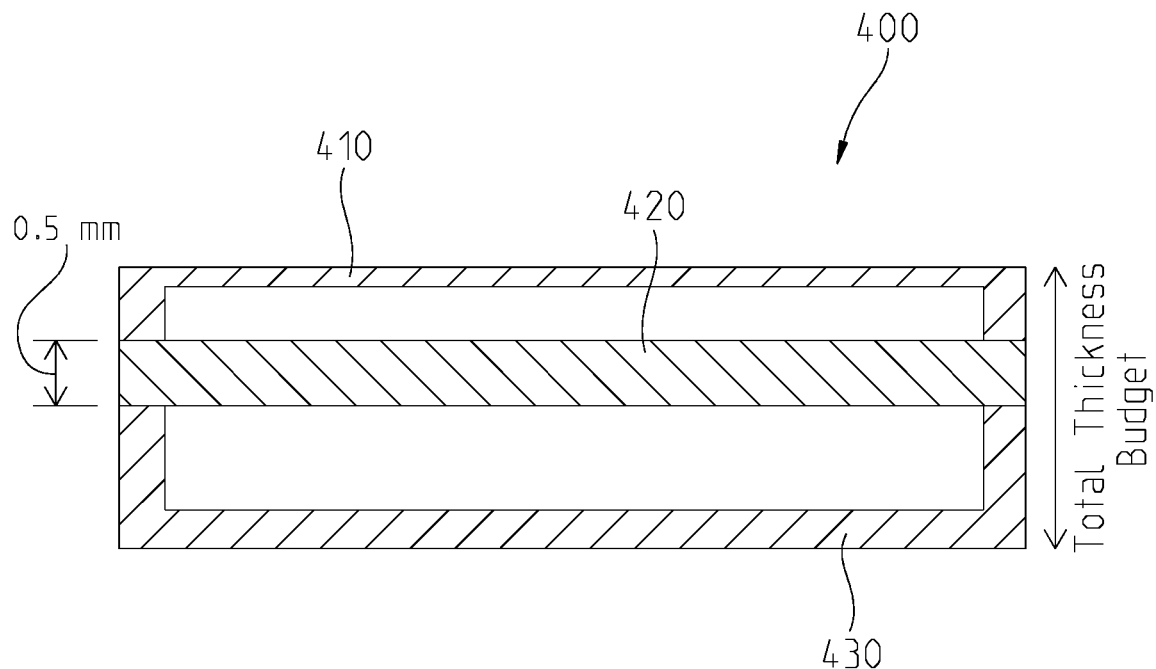
FIG. 11 is a simplified cross-sectional view of a portable device with a traditional heat pipe installed thereon.

The components of the portable device are shown in FIG. 11, and may include a plastic or metal front surface 410 including the front screen, a middle bracket or frame 420, and a plastic or metal back surface 430.

The front surface 410 may include an LED glass screen surface. The middle frame 420, and the back surface are typically an aluminum alloy, 430. In particular, both the middle frame 420 and the back surface 430 may be made of aluminum or an aluminum magnesium alloy, for light weight and strength. The middle frame 420 provides the mechanical rigidity and together with the back surface, may define the skeleton of the portable device, and providing mechanical strength and robustness.

The middle frame 420 often provides structural support and rigidity to the portable device 400. The middle frame generally spans the interior region of the enclosure. The circuitry which controls the portable device may be contained on an integrated circuit chip 450, enclosed within the outer casing and may be attached to the middle frame. A fan may also be provided inside the outer casing to spread the heat typically generated by the circuitry which operates the portable device. The middle frame 420 is generally about 0.2 to 0.8 mm, and often about 0.5 mm thick, as shown in FIG. 11.

The front surface 410 and metal or plastic back surface 430 may form the outer casing of the portable device, in contrast to the middle frame 420 which is generally disposed in the interior of the outer casing and is often metal. Most smart phones, for example, have a number of layers forming an outer shell and an internal skeleton. FIG. 11 is thus a simplified, generic, cross-sectional view of a portable device 400, such as a smart phone.

Figure 12:
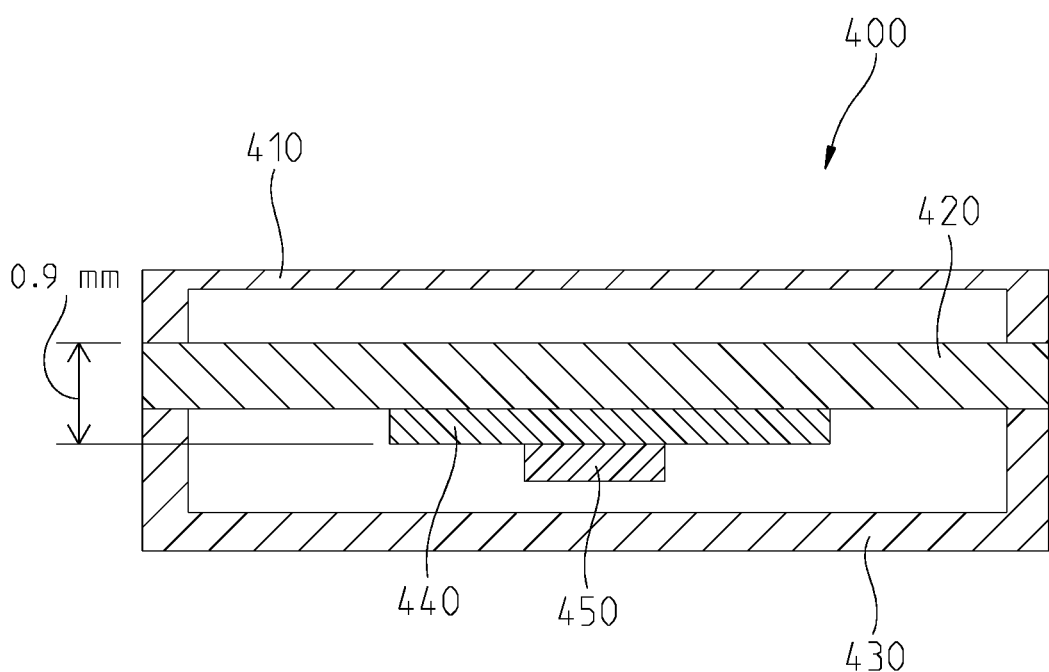
FIG. 12 is a simplified cross-sectional diagram of a portable device with a titanium based thermal ground plane installed therein.

To dissipate the heat generated by the IC, a heat pipe 440 is often included in the enclosure. FIG. 12 shows an embodiment of a portable device 400 using a heat pipe 440. The existing heat pipe technology 440 is relatively thick, and inefficient. Most embodiments of the existing heat pipe technology are on the order of 0.4 mm thick, and contribute significantly to the overall thickness and weight of the smartphone. Because space and weight are at such a premium in these small devices, companies are desperately looking for thinner and more effective thermal solutions for these portable devices. Cooler temperatures enhance the reliability and the lifetime of the device, reduce or completely eliminate the fan noise of the portable device and also extend the battery life.

One approach to dissipating more heat when using the heat pipe is to dispose thin graphite sheets in the interior, disposed between the chip and the front frame surface 410, the middle frame 420, or the rear back surface 430. However, graphite is expensive, the layers thick, about 0.3 mm, and cannot be made thinner because of this mechanical fragility and tendency to fracture. As a thermal solution, it is not very efficient, and as a conductive element, it has the possibility of shorting the IC chip 450. Accordingly, manufacturers are eager for a new solution to conduct the heat away from the chip such that the portable device is an efficient and reliable and comfortable to use, and to maximize the time between battery charges. Note that the total thickness of the portable device middle frame with a heat pipe is nearly 1 mm.

In contrast to the traditional heat pipe 440, a TiTGP may be used to dissipate the heat generated by the heat sources, especially the IC chip 450 within the portable device enclosure 400.

Because the overall thickness of the wick structure 210 may be on the order of between about 0.1 and 0.15 mm, the entire thickness of the thermal ground plane plus the titanium base metal frame maybe on the order of 0.6 to 0.65 mm thick. Accordingly, the overall thickness of the middle frame (including the TiTGP) of the portable devices may be on the order of 0.6 to 0.65 mm. This allows a reduction in the overall thickness of nearly a half of a millimeter, as will be described further below. This represents a substantial improvement in thickness of the previously described traditional heat pipe technology as was shown in FIG. 12. The integrated circuit or chip for as before may be disposed directly onto the surface of the wicking structure 210. Any thermally conductive adhesive such as thermal grease or thermal epoxy or potting compound may be used to attach the chip 450 to the wick structure 210.

The remainder of FIGS. 13-18 illustrate various ways of implementing the TiTGP of FIG. 10 into a portable device 400. As will be seen in the description that follows, the TiTGP is used as both a thermal structure (to dissipate heat) and a mechanical structure (for strength and rigidity). The use of titanium for the TiTGP is an important performance advantage in this regard, and motivates its use despite the higher cost of the titanium in general. Accordingly, the TiTGP can be both a structural material used to build mobile application and a thermal module as well. Accordingly, the TiTGP 500 has structural as well as thermal advantages.

Disclosed here and illustrated in FIGS. 13-18, is an improved portable device based on a titanium heat pipe or titanium Thermal Ground Plane (TiTGP). The TiTGP 500 may be as described above in FIGS. 1-10, but adapted for the portable device application. Generally, the portable device may comprise a thermal ground plane with a vapor cavity disposed in the interior of the portable device, the thermal ground plane comprising a titanium backplane 120 and wicking structure on a metal substrate, an integrated circuit in thermal communication with the thermal ground plane, and an outer casing enclosing the thermal ground plane and the integrated circuit.

In one embodiment, the portable device may include a middle frame member with a gap that accommodates the thermal ground plane 500, the thermal ground plane 500 having a wicking structure 510 and a backplane 520. This embodiment is shown first in FIG. 13. In another embodiment, the TiTGP 500 is embedded or attached to an existing middle frame structure 420, which may be titanium, aluminum, or an aluminum magnesium alloy. In either case, the middle frame provides both mechanical (strength and stiffness) and thermal functions (heat dissipation) while still remaining extremely thin. This design is shown second in FIG. 14.

Figure 13:
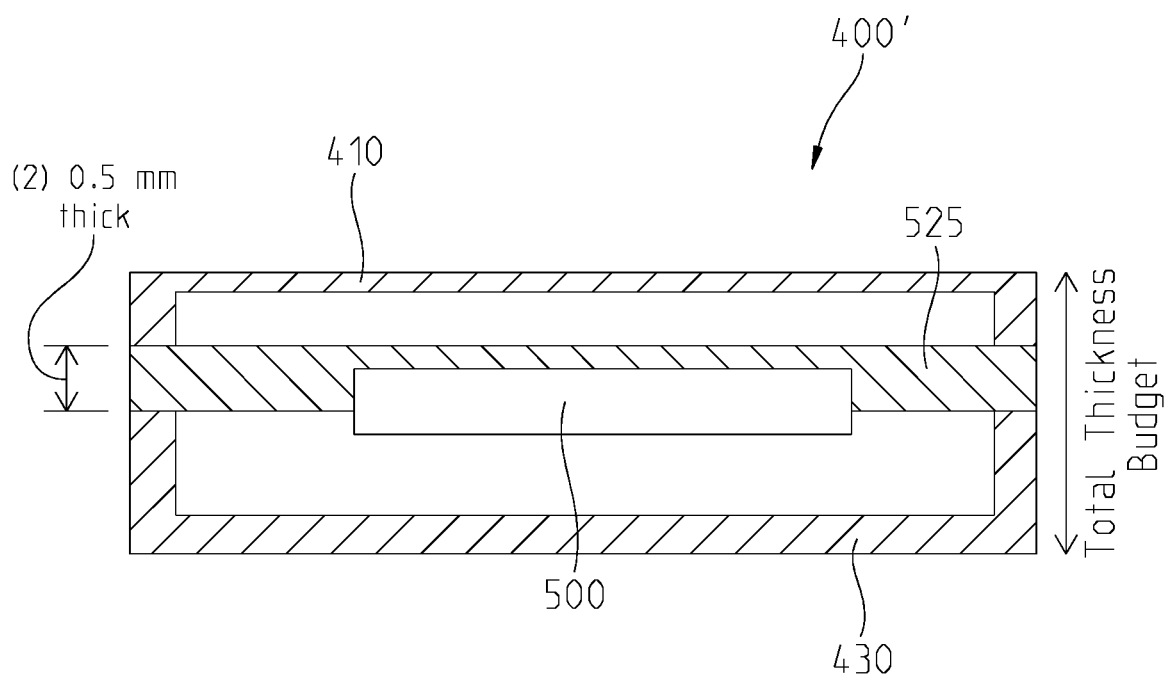
FIG. 13 is a simplified cross-sectional view of a portable device with a titanium based thermal ground plane and an integrated circuit chip installed thereon.

The first exemplary embodiment of the portable device 400' using a TiTGP is shown in the simplified cross-section of FIG. 13. Shown in FIG. 13 is the front surface 410 including the screen, the back surface 430 and a middle frame 420. The middle frame 420 maybe an aluminum or aluminum based alloys or titanium member with the TiTGP 500 formed or embedded therein. Accordingly, in one embodiment, the portable device may include a thermal ground plane, wherein the thermal ground plane is a module inserted into a middle frame member of the portable device.

In this embodiment, the middle frame 420 may have a cavity formed therein to accommodate an inserted TiTGP 500. In this case, a cavity approximately between about 100 and about 1000 microns deep may be etched into the titanium based middle frame 420. The TiTGP may then be attached there in by welding, or bonding, gluing, for example. Accordingly, the portable device may have a thermal ground plane disposed in a cavity formed in a middle frame member 420, wherein the middle frame member 420 comprises titanium. The cavity formed in the middle frame member may be about 400 microns in depth, leaving about 100 microns of titanium spanning the middle frame member.

Figure 14:
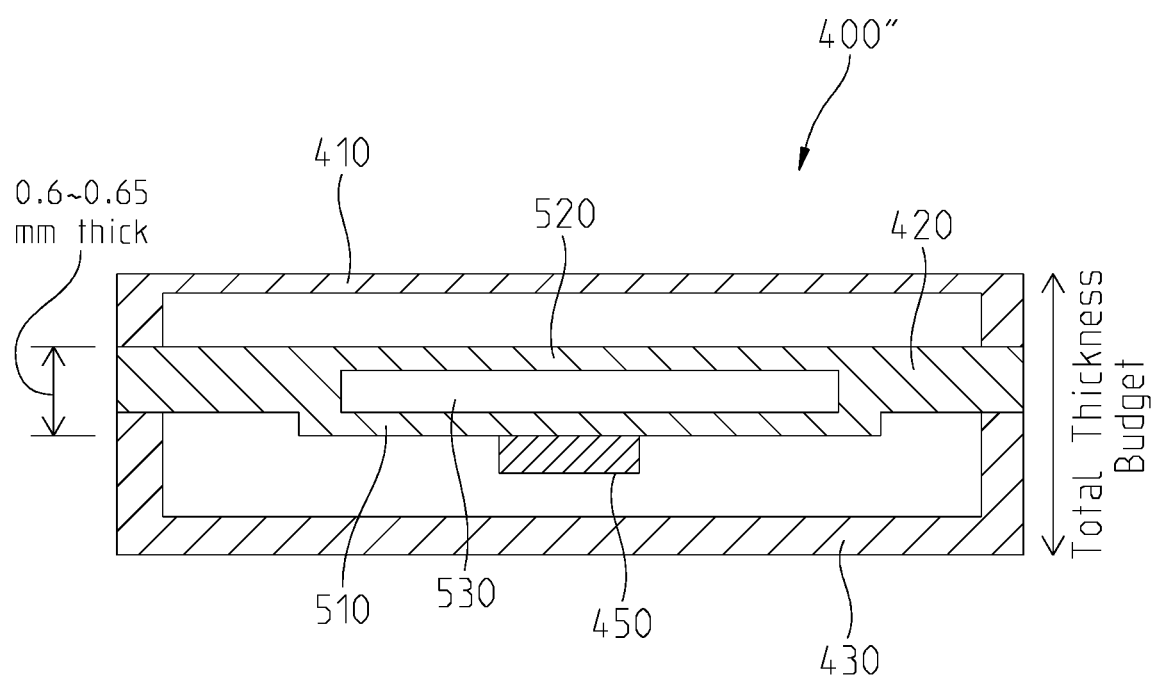
FIG. 14 is a simplified cross-sectional view of a first embodiment of the thermal ground plane, adapted for use in a portable device.

The second exemplary embodiment of the portable device 400" using a TiTGP, is shown in FIG. 14. The portable device 400" may include a middle frame member 420 and a thermal ground plane, the thermal ground plane 500 having a wicking structure 510 and a backplane 520, wherein the middle frame member 420 also forms the backplane 520 of the thermal ground plane 500. The device 400" may also include an integrated circuit, wherein the integrated circuit is affixed to and in thermal communication with the wicking structure 510 of the thermal ground plane 500. The vapor cavity 530 of the thermal ground plane 500 may be formed between the titanium backplane 520, and sealed by welding to a wicking structure 510, forming the thermal ground plane 500.

Accordingly, in this embodiment, the TiTGP forms an integral component, such that the middle structure is incorporated into the design of the TiTGP, serving as the backplane 120. In this case, the middle frame 420 may comprise titanium. A 0.4 mm cavity may be formed in the middle titanium member 420 which will be the vapor cavity 530 for the TiTGP 500. Accordingly, in this embodiment, the portable device may include a thermal ground plane 500 which in turn comprises a vapor cavity 530, wherein the vapor cavity 530 is enclosed by the wicking structure 510 and the titanium backplane 520. In this embodiment, the wicking structure 510 is bonded to the metal backplane to form a hermetically-sealed vapor cavity. The cavity may be sealed by a laser weld, to form a hermetically-sealed vapor cavity, as described previously. The vapor cavity may be configured with one or more recessed regions, to provide varying vapor chamber heights, as described previously.

In this embodiment, the TiTGP 500 is formed directly in and from the material of the middle frame 420, and the metal of the middle frame forms the backplane 120 of the TiTGP. The remainder of the TiTGP, that is, the wicking structure 210 and the metal backplane 120 may be formed from the other surfaces as shown. In this embodiment, the wicking structure 540, may be the surface to which the chip 450 is attached. In this embodiment, the TiTGP 500 including a titanium middle frame 520 totally replaces the middle frame as a unit.

TiTGP in this embodiment may use the titanium middle frame 520 as its backplane 120. Accordingly, the cavity formed may be about 3 cm across, although the titanium middle frame will be substantially wider. Because the middle frame 520 extends across the entire width of the portable device 400, the cavity width is only a fraction of the width of the titanium middle frame, which extends at least a cm beyond the vapor cavity on each side. The extensive width of the titanium middle frame gives the portable device 400 its structural rigidity and helps to dissipate the heat from the IC. Accordingly, the thermal ground plane may form a structural element of the portable device.

Figure 15:
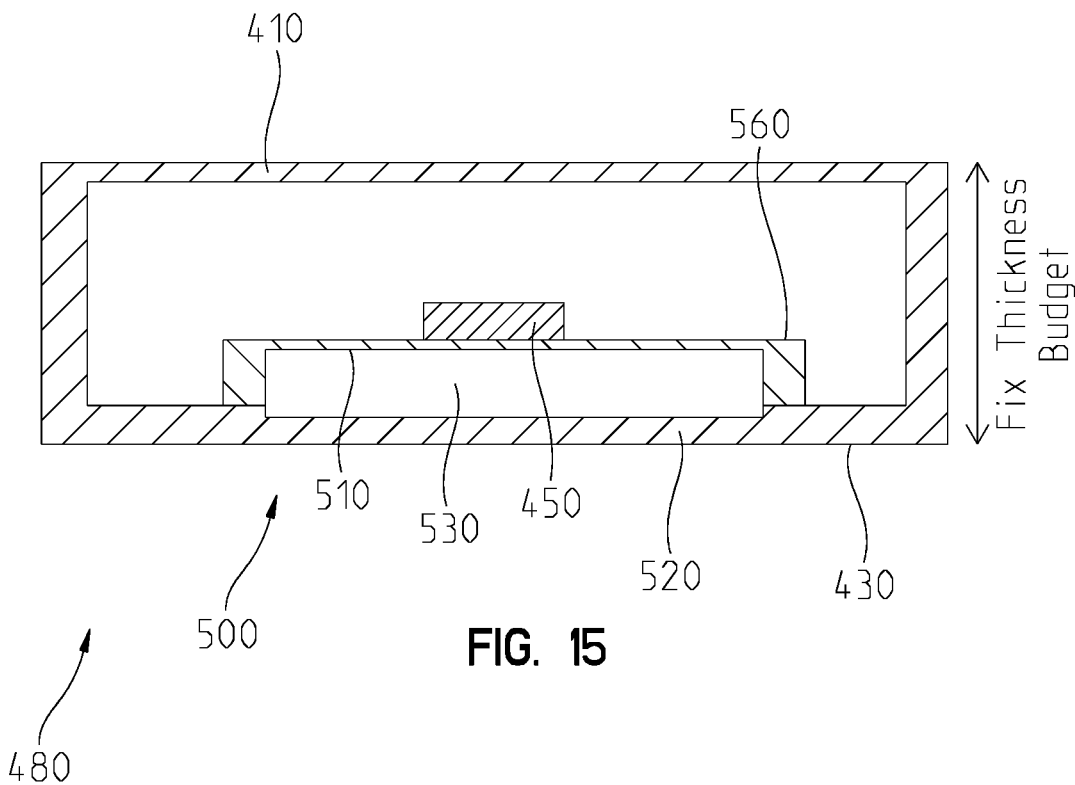
FIG. 15 is a simplified cross-sectional view of a second embodiment of the thermal ground plane, adapted for use in a portable device.

Alternatively, the TiTGP can be used as part of the back cover 430 of a portable device. This embodiment, portable device 480 is illustrated in FIG. 15. FIG. 15 shows the wick structure 510 and vapor cavity mounted on the back surface 430 of the portable device. In this embodiment, the back surface 430 is the obverse side of the portable device 400 to the front surface 410 which includes a screen. The wicking structure 510 of the TiTGP is in thermal communication with the chip 450. The TiTGP may either be installed in a gap in the back surface 430, in analogy to the middle frame installation shown in FIG. 13, or the back surface 430 of the portable device may also serve as the backplane 520 of the TiTGP, in analogy to the system shown in FIG. 14. By extension, the TiTGP may also be installed on the front surface, if that surface is metallic.

Because of the very slim form factor of the TiTGP, it is also possible to couple two thermal ground planes together, such that the TiTGP includes a plurality of vapor cavities and wicking structures. In small, enclosed, portable devices, the thermal module must reject the heat from chip and spread it out across the device uniformly (isothermal condition). The plural TiTGPs 600, 700 concept may provide an excellent isothermal surface for this heat dissipation.

Figure 16A:
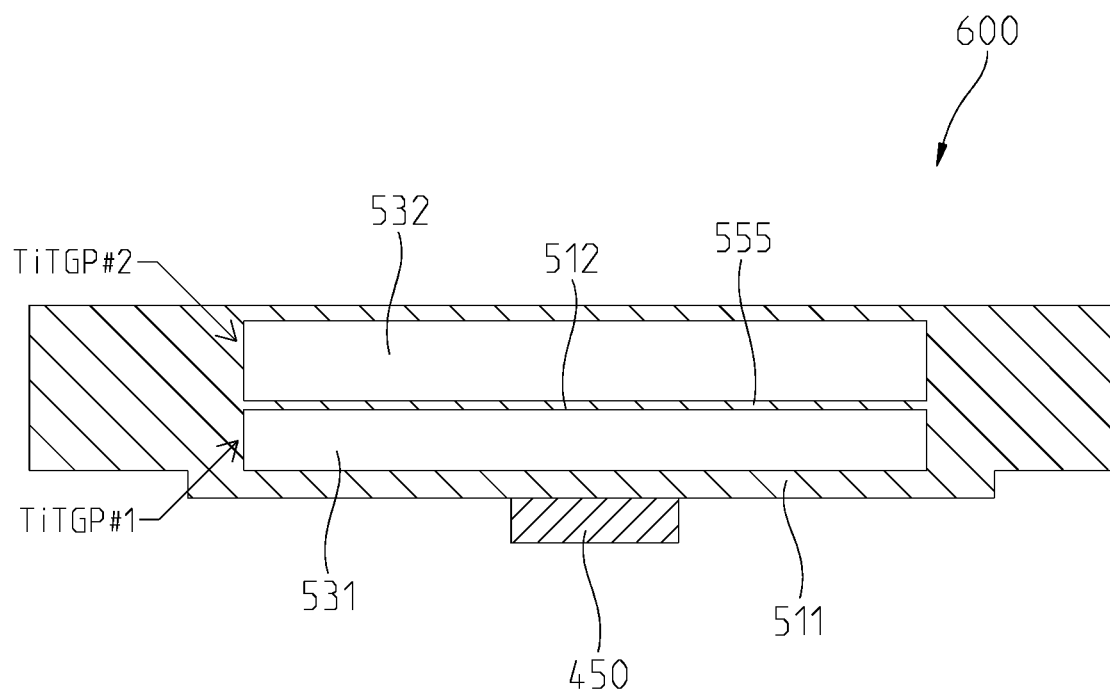
FIG. 16(A) is a simplified cross-sectional view of a first embodiment of the thermal ground plane, having a plurality of thermal ground planes, adapted for use in a portable device.

The plural TiTGP 600, 700, 800 has much higher thermal performance than a single TiTGP. Shown in FIG. 16(A) is a dual TiTGP 600 comprising two vapor cavities 531 and 532 located one above the other and in thermal communication through a common member 555. The two vapor cavities 531 and 532 also have two corresponding wicking structures 511 and 512.

TiTGP #1 has vapor cavity 531 and may be disposed beneath TiTGP #2 and may be thermally coupled to the heat generating chip 450. In plural TiTGP 600, the heat source chip 450 may be coupled to the underside of TiTGP #1, and in thermal communication with the wicking structure 511 of TiTGP #1. TiTGP #1 then transfers its heat to TiTGP #2 through common member 555. The common member 555 may provide a conductive path to transfer heat from TiTGP #1 to #2, more specifically to its wicking structure 512. Using a common member 555 allows this efficient thermal transfer. It avoids using any other thermal interface film/material which would otherwise drop the temperature and consequently reduce the thermal performance of the thermal ground plane 500. Accordingly, TiTGP #2 dissipates heat from TiTGP #1 via the common member indicated in FIG. 16(A). This is an extremely efficient heat transfer architecture. A salient feature of this structure is that the backplane of one TiTGP may serve as the wicking structure of another TiTGP.

Figure 16B:
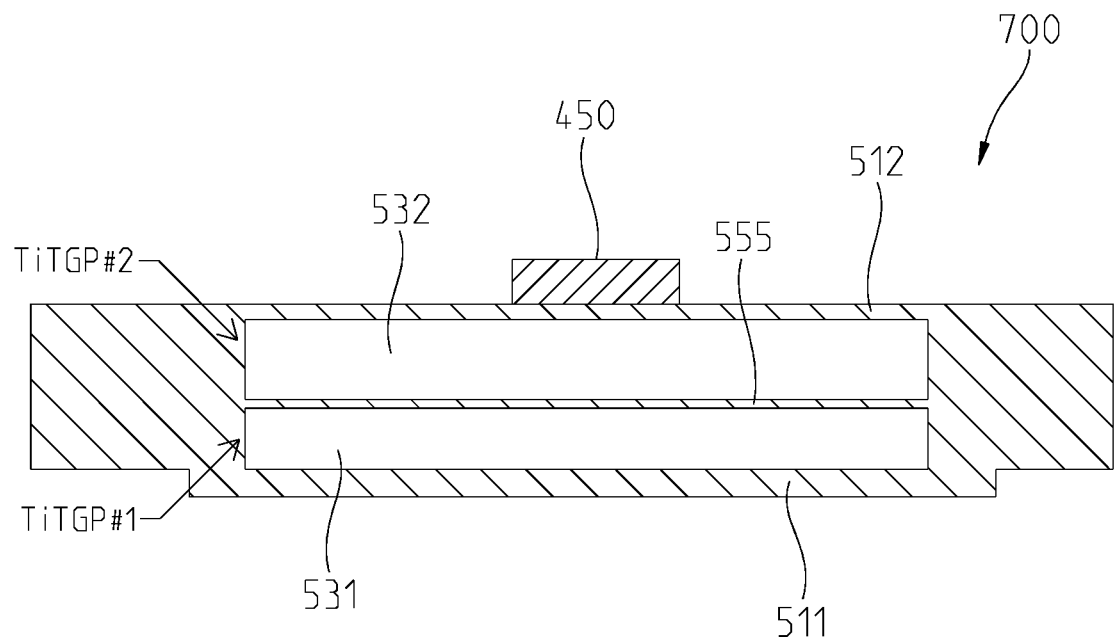
FIG. 16(B) shows another embodiment of the plural TiTGP.

FIG. 16(B) shows another embodiment of the plural TiTGP 700. Like TITGP 600, TiTGP 700 has a plurality of TiTGPs, for example, TiTGP #1 and TiTGP #2. TiTGP #1 has vapor cavity 531 and may be disposed beneath TiTGP #2. TiTGP #2 may be thermally coupled to the heat generating chip 450. In particular, the heat source chip 450 may be coupled to the topside of TiTGP #2, and in thermal communication with the wicking structure 512 of TiTGP #2. TiTGP #2 then transfers its heat to TiTGP #1 through common member 555. The common member 555 may provide a conductive path to transfer heat from TiTGP #2 to #1, more specifically to its wicking structure 511. Using a common member 555 allows this efficient thermal transfer. It avoids using any other thermal interface film/material which would otherwise drop the temperature and consequently reduce the thermal performance of the thermal ground plane 500. Accordingly, TiTGP #1 dissipates heat from TiTGP #2 via the common member indicates in FIG. 16(B). This is also an extremely efficient heat transfer architecture.

Figure 16C:
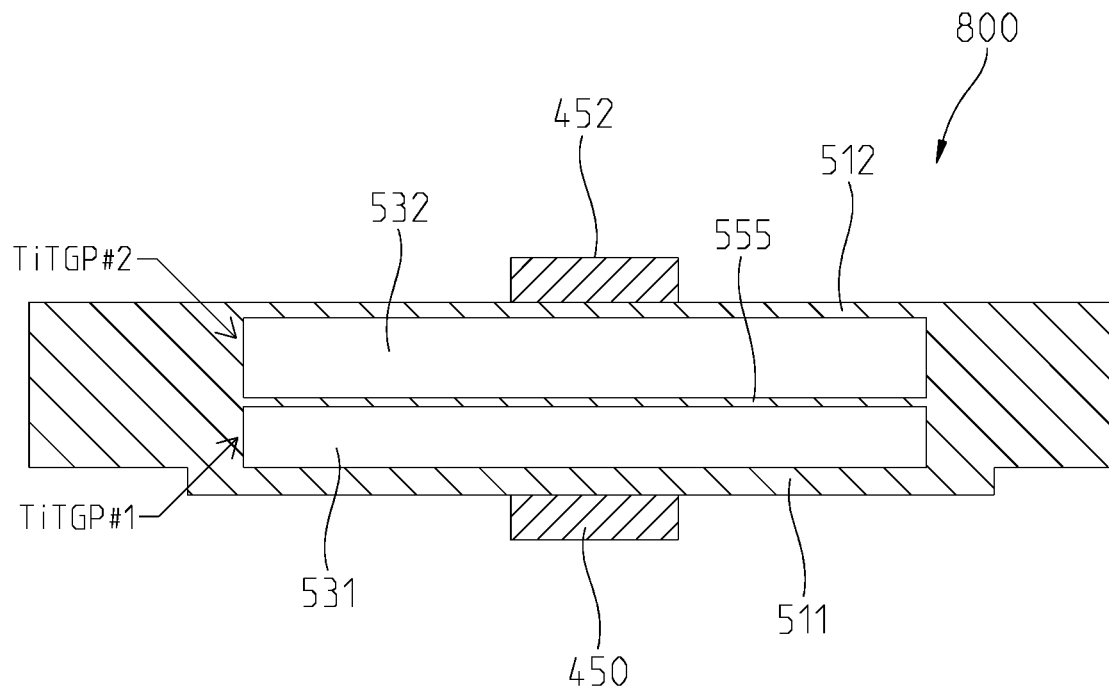
FIG. 16(C) shows yet another embodiment of the plural TiTGP.

FIG. 16(C) shows yet another embodiment of the plural TiTGP 800 which dissipates heat from two integrated circuit chips 450 and 452. Like TITGP 600 and 700, TiTGP 800 has a plurality of TiTGPs, for example, TiTGP #1 and TiTGP #2. TiTGP #1 has vapor cavity 531 and may be disposed beneath TiTGP #2. TiTGP #1 may be thermally coupled to the heat generating chip 450 on its underside and TiTGP #2 may be thermally coupled to a second heat generating chip 452 on its topside. In particular, the heat source chip 450 may be coupled to the topside of TiTGP #2, and in thermal communication with the wicking structure 512 of TiTGP #2. TiTGP #2 then transfers its heat to TiTGP #1 through common member 555. The common member 555 may provide a conductive path to transfer heat from TiTGP #2 to #1, more specifically to its wicking structure 511. Using a common member 555 allows this efficient thermal transfer. It avoids using any other thermal interface film/material which would otherwise drop the temperature and consequently reduce the thermal performance of the thermal ground plane 500. Accordingly, TiTGP #1 dissipates heat from TiTGP #2 via the common member indicates in FIG. 16(B). This is also an extremely efficient heat transfer architecture.

Figure 17:
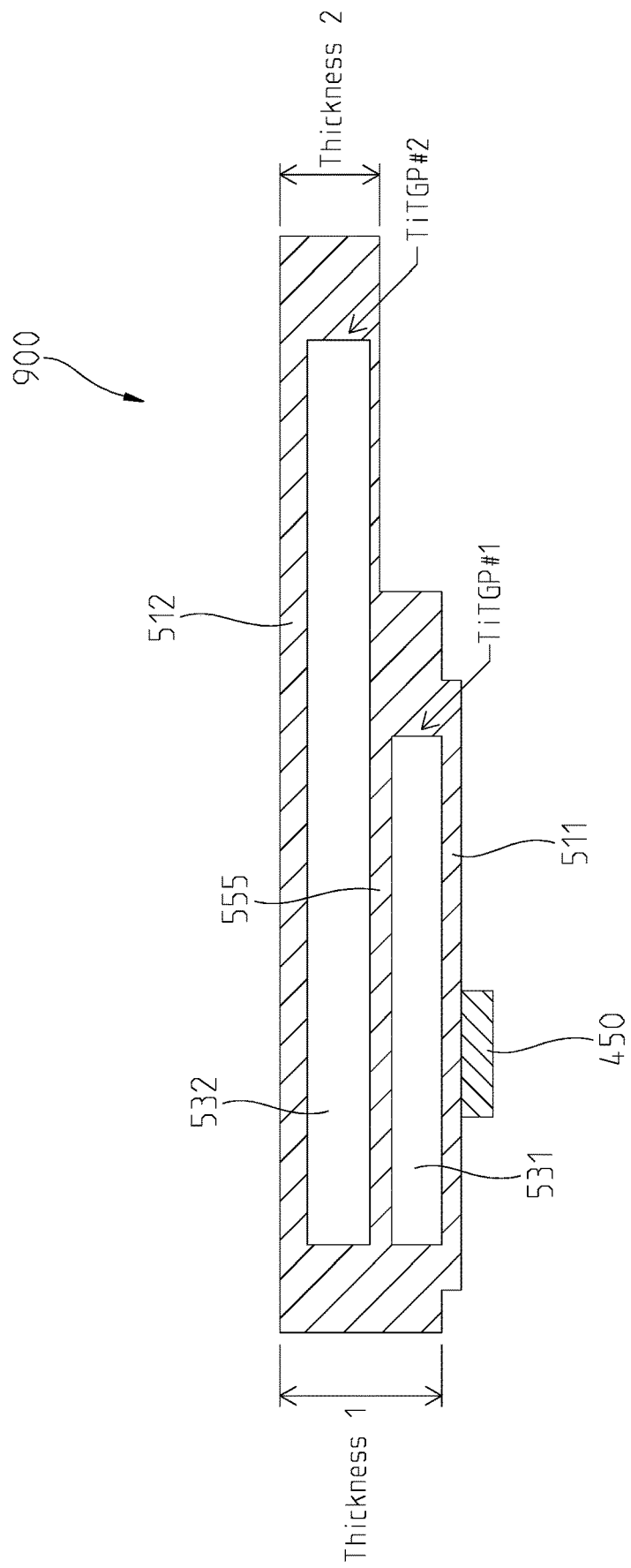
FIG. 17 is a simplified cross-sectional view of a second embodiment of the thermal ground plane having a plurality of thermal ground planes, adapted for use in a portable device.

FIG. 17 shows another embodiment of plural TiTGP 900, which has a non-uniform thickness by making one vapor cavity 531 smaller than the overlying vapor cavity 532. The non-uniform thickness thermal module may be extremely attractive to portable applications, because the heat generating chip 450 can be compacting arranged in this structure, as shown, with no loss of thermal performance. Other components in the portable device may be arranged in the available space. In particular, a relatively bulky battery may be placed between TiTGP #2 (thickness #2), while TiTGP #1 remains relatively thin (thickness #1).

While FIGS. 16 and 17 show plural TiTGPs 600 and 700 comprising dual vapor cavities and wicking structures, it should be understood that this is exemplary only, and that the plural TiTGP may include any number of vapor cavities and wicking structures.

Figure 18:
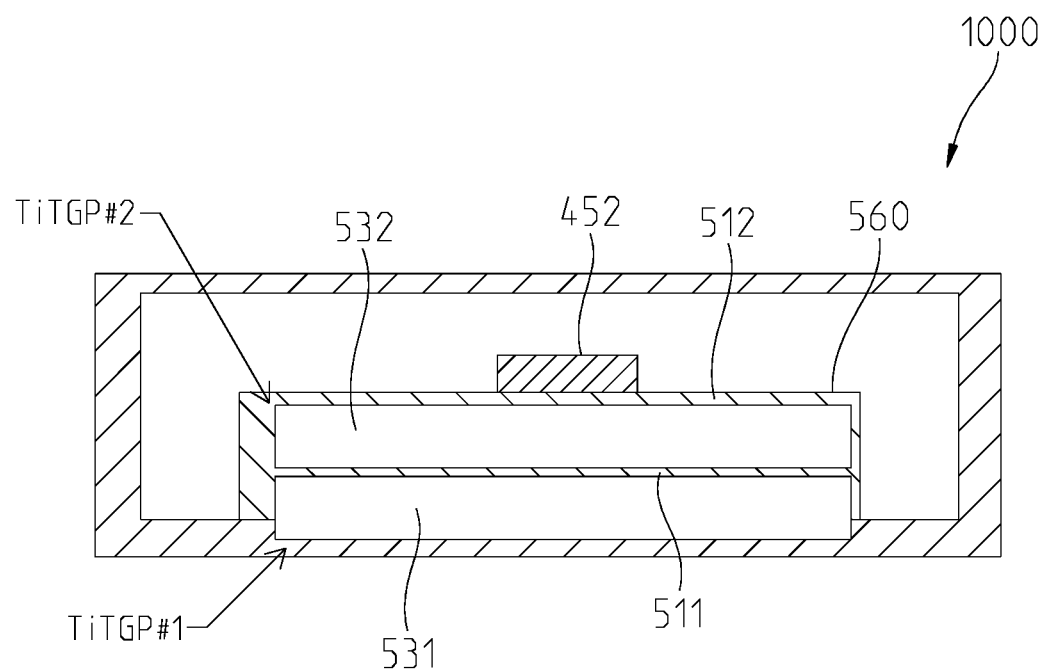
FIG. 18 is a simplified cross-sectional view of a third embodiment of the thermal ground plane having a plurality of thermal ground planes, adapted for use in a portable device.

FIG. 18 shows another embodiment of a plural TiTGP installed in a portable device 1000. In this embodiment, a TiTGP similar to TiTGP 600 is installed in the portable device having, as before, a plastic or metal front surface 410 including the front screen, and a plastic or metal back surface 430. The front surface 410 and metal or plastic back surface 430 may form the outer casing of the portable device. However, in this case, the wicking structure 512 of TiTGP #2 may form an isothermal inner casing within the portable device 1000. Accordingly, the wicking structure 512 may be a titanium-based member, providing structural as well as thermal assistance. At least in part as a result of the use of the TiTGP shown in FIG. 18, the outer casing may also be substantially isothermal. "Substantially isothermal should be understood to mean that there is a temperature gradient of less than about 1 OC, and more preferably, less than about 1 C across the structural member, because of the use of the TiTGP. Because of the very effective distribution of heat, a fan may not be necessary inside the outer casing of the portable device 1000. This may allow reduced weight, cost and energy requirements, each of which is a critical figure of merit in portable devices.

More generally, the TiTGPs shown in FIGS. 13-18 may be in thermal communication with at least one structural element of the portable device. These structural elements are the components that give the portable device most of its strength and stiffness, and may form the skeleton of the device, and may include at least the middle frame 420 and the back surface 430. The surfaces of the TiTGP may also be structural elements, 520 and 560. These structural members are generally metallic, and may include, for example, the front surface 410, the middle frame 420 and the back surface 430. More preferably, the TiTGP comprises titanium with a laser weld sealing the back. As a result, the surface of this structural member which is coupled to the TiTGP may be substantially isothermal, with a temperature gradient of less than about 10 C.

Discussion now turns to the fabrication of the TiTCPs for the portable applications. The wicking structures, and outer shell of the thermal modules 500, 600 and 700 may be made by stamping the shapes from a metal material. The smaller microstructures may be made by microstamping. Alternatively, the contours and cavities may be made by chemical etching using, for example, hydrofluoric acid (HF) and nitric acid ((HNO3). As is known in the art, portions of the titanium material can be protected from the etchant by a coating or masking layer. All exposed surfaces may then be etched to form the grooves, cavities and smaller structures.

The TiTGP may be provided with a quantity of working fluid using, for example, the method described in Ser. No. 14/749,439. The working fluid may be, for example, water, and the sealing methodology used to enclose the working fluid in the vapor cavity may be laser welding.

Accordingly, disclosed here is a portable device including a thermal ground plane containing a vapor region and a liquid region for a working fluid, disposed within an outer casing of the portable device, wherein the thermal ground plane comprises a titanium backplane, a vapor cavity and wicking structure formed on a metal substrate, an integrated circuit chip in thermal communication with the thermal ground plane such that heat generated by the chip is distributed throughout the portable device by the thermal ground plane, and wherein the thermal ground plane is in thermal communication with at least one structural element of the portable device, and the at least one structural element is substantially isothermal, wherein the temperature gradient across the structural element is less than 10° C.

The portable device may have a vapor cavity which is enclosed by the metal substrate and the titanium backplane, wherein the metal substrate is sealed by a laser weld to the metal backplane to form a hermetically-sealed vapor cavity. The structural element may be at least one of a middle frame member, a front face, and a back surface of the portable device, wherein the front face and the back surface define the outer casing of the portable device, and the middle frame member is a structural member within the outer casing.

The thermal ground plane may further comprise a wicking structure, wherein the wicking structure may include a plurality of microstructures that are interleaved with at least one region of the wicking structure to form high effective aspect ratio wicking structures, in at least one region of the thermal ground plane, and wherein one or more of the microstructures have a height of between about 1-1000 micrometers, a width of between about 1-1000 micrometers, and a spacing of between about 1-1000 micrometers, and wherein the micro structures comprise at least one of channels, pillars, grooves and trenches. The thermal ground plane may be a structural element of the portable device, and is mechanically coupled to the outer or inner or middle casing of the portable device but suspended inside the outer casing by attachment to the middle frame member. The thermal ground plane may be disposed in a cavity formed in a middle frame member, wherein the middle frame member comprises titanium. The cavity may be between about 100 and about 1000 microns deep, leaving about 100 to 200 microns of titanium spanning the middle frame member across the cavity.

The thermal ground plane may further comprise a titanium enclosure and a titanium wicking plane, wherein the titanium enclosure and the titanium wicking plane together are between about 0.3 mm and about 1.5 mm thick. The thermal ground plane may further include at least one intermediate substrate having a region with a plurality of protrusions that fit conformally into the wicking structure, to form narrow fluid passages through which the fluid is driven by capillary forces, wherein the protrusions are shaped to fit into features in the wicking structure. The effective aspect ratio h/w of the fluid passages between the wicking channel and the intermediate substrate is greater than 1, wherein h is the effective height and w is the width of the fluid channel. A surface of at least one region of the thermal ground plane may be comprised of nanostructured titania (NST).

The thermal ground plane may be disposed on the back surface of the portable device, and wherein the back surface also serves as the wicking structure of the thermal ground plane. The chip may be disposed substantially in the middle of a lateral extent of the thermal ground plane. The thermal ground plane may include a module inserted into a middle frame member of the portable device.

The portable device may have a titanium middle frame member disposed within the outer casing, wherein the middle frame member forms a backplane of the thermal ground plane, and an integrated circuit chip, wherein the integrated circuit is affixed to and in thermal communication with the thermal ground plane. Alternatively, the vapor cavity may be formed in the titanium middle and outer frame member, and sealed by a wicking structure to form the thermal ground plane.

In other embodiments, the thermal ground plane comprises a plurality of vapor chambers and a plurality of wicking structures. A first vapor chamber may be in thermal communication with at least one other vapor chamber through a common metal member, wherein the common metal member is shared structurally and thermally between the plurality of vapor chambers, such that heat generated by the chip is distributed throughout the portable device, and the outer casing is substantially isothermal. The thermal ground plane with plurality of vapor chambers may have a non-uniform cross section. In the plural thermal ground plane, the vapor chambers each contain wicking structures, and the wicking structures of the plural vapor chambers are disposed above one another.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A portable device having an enclosure, comprising:
   a thermal ground plane disposed within the enclosure wherein the thermal ground plane contains a vapor region and a liquid region for a working fluid, disposed within the enclosure of the portable device, wherein the thermal ground plane comprises a metal plane,
   a vapor cavity and wicking structure formed on a metal substrate and wherein the thermal ground plane further comprises at least one intermediate substrate with a plurality of protrusions disposed in the vapor cavity adjacent to the wicking structure, wherein the plurality of protrusions are coupled to each other by at least one cross-member and wherein the protrusions fit conformally into the wicking structure and wherein the metal plane includes supporting pillars that mechanically support a spacing between the metal plane, the wicking structure and the intermediate substrate, and structurally support the thermal ground plane;
   an integrated circuit chip disposed within the enclosure, wherein the integrated circuit chip is in thermal communication with the thermal ground plane such that heat generated by the chip is distributed throughout the portable device by the thermal ground plane; and
   wherein the thermal ground plane is in thermal communication with at least one structural element of the portable device, and wherein the thermal ground plane is mechanically coupled to the portable device such that it provides mechanical strength and robustness to the enclosure.

* * * * *